(12) United States Patent
Seo

(10) Patent No.: US 9,397,179 B1
(45) Date of Patent: Jul. 19, 2016

(54) SEMICONDUCTOR DEVICE

(71) Applicant: SAMSUNG ELECTRONICS CO., LTD., Suwon-si, Gyeonggi-do (KR)

(72) Inventor: Kang-Ill Seo, Chungcheongbuk-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/624,098

(22) Filed: Feb. 17, 2015

(51) Int. Cl.
  *H01L 27/088* (2006.01)
  *H01L 29/423* (2006.01)
  *H01L 29/06* (2006.01)
  *H01L 29/786* (2006.01)

(52) U.S. Cl.
  CPC ...... *H01L 29/42392* (2013.01); *H01L 29/0669* (2013.01); *H01L 29/78696* (2013.01)

(58) Field of Classification Search
  USPC ................. 257/E43.001–E43.007,
    257/E27.005–E27.006, E27.008, E29.164,
    257/E29.167, E29.323, E21.633–E21.665,
    257/225–234, E27.076, E21.666–E21.678,
    257/E27.098–E27.101, E27.077, 288, 901,
      257/E29.049–E29.067, E29.237,
      257/E29.256–29.26, E21.43, E21.618, 7,
    257/334, 427, 444, 446, 491, 663, 713, 262,
      257/368–401, E29.255–E29.313,
      257/E29.315–E29.316, E21.409–E21.449,
      257/E21.473; 438/3, 785, E21.208,
      438/292–308, 48–98, 135, 151, 197, 199,
      438/201, 207, 216; 365/158, 171, 173
  See application file for complete search history.

(56) References Cited

U.S. PATENT DOCUMENTS

| | | | |
|---|---|---|---|
| 6,274,467 B1 | 8/2001 | Gambino et al. | |
| 7,642,578 B2 | 1/2010 | Lee et al. | |
| 7,838,367 B2 | 11/2010 | Ponomarev et al. | |
| 8,022,439 B2 * | 9/2011 | Kajiyama | B82Y 10/00 257/192 |
| 8,110,471 B2 | 2/2012 | Lee et al. | |
| 8,168,524 B2 | 5/2012 | van Schaijk et al. | |
| 2008/0224233 A1 * | 9/2008 | Masliah | H01L 29/402 257/386 |
| 2012/0074472 A1 * | 3/2012 | Sakanishi | H01L 29/66681 257/288 |
| 2012/0146053 A1 | 6/2012 | Saitoh et al. | |
| 2013/0240828 A1 | 9/2013 | Ota et al. | |
| 2013/0240836 A1 | 9/2013 | Lee et al. | |
| 2014/0084371 A1 | 3/2014 | Basker et al. | |
| 2014/0087526 A1 | 3/2014 | Basker et al. | |

FOREIGN PATENT DOCUMENTS

| | | |
|---|---|---|
| JP | 2011-003797 | 1/2011 |
| JP | 2012-124296 | 6/2012 |
| JP | 2013-191698 | 9/2013 |
| KR | 100594327 | 6/2006 |
| KR | 1020130079703 | 7/2013 |

* cited by examiner

Primary Examiner — Dao H Nguyen
Assistant Examiner — Tram H Nguyen
(74) Attorney, Agent, or Firm — F. Chau & Associates, LLC

(57) ABSTRACT

A semiconductor device including an active region having a field insulating layer disposed at a first side thereof; a first wire pattern formed on the active region and extended in a first direction; a normal gate formed on the active region, extended in a second direction crossing the first direction and covering the first wire pattern; and a dummy gate having a first part which overlaps a first end of the field insulating layer and a second part which overlaps the active region, and wherein the dummy gate is formed on the active region and spaced apart from the normal gate in the first direction, wherein the first wire pattern penetrates a third part of the dummy gate and the dummy gate covers a first end of the first wire pattern.

23 Claims, 28 Drawing Sheets

SEMICONDUCTOR DEVICE

TECHNICAL FIELD

The present inventive concept relates to a semiconductor device, and more particularly, to a semiconductor device having a gate-all-around structure.

DISCUSSION OF THE RELATED ART

In a gate-all-around structure, such as a transistor, a silicon nanowire is formed on a substrate and a gate is formed to surround the silicon nanowire.

SUMMARY

The present inventive concept provides a semiconductor device that has a gate-all-around structure to facilitate scaling and effectively suppress a short channel effect (SCE), for example.

In an exemplary embodiment of the present inventive concept, there is provided a semiconductor device, comprising: an active region having a field insulating layer disposed at a first side thereof; a first wire pattern formed on the active region and extended in a first direction; a normal gate formed on the active region, extended in a second direction crossing the first direction and covering the first wire pattern; and a dummy gate having a part which overlaps a first end of the field insulating layer and a second part which overlaps the active region, wherein the dummy gate is formed on the active region and spaced apart from the normal gate in the first direction, wherein the first wire pattern penetrates a third part of the dummy gate and the dummy gate covers a first end of the first wire pattern.

The semiconductor device further comprises a normal gate insulating layer formed along a circumference of the first wire pattern and a first side wall of the normal gate; and a dummy gate insulating layer formed along a circumference of the first end of the first wire pattern, a cross-section at an end point of the first end of the first wire pattern, and a first side wall of the dummy gate.

The semiconductor device further comprises sources or drains disposed at first and second sides of the normal gate, wherein the sources or drains include an epitaxial layer.

The epitaxial layer includes a first part and a second part, the first part is directly connected with the first wire pattern, and the second part contacts the normal gate insulating layer and the dummy gate insulating layer.

The epitaxial layer has a diamond shape, a circular shape, or a rectangular shape.

The semiconductor device further comprises normal gate spacers formed at the first side wall and a second side wall of the normal gate; and dummy gate spacers formed at the first side wall and a second side wall of the dummy gate, wherein the normal gate insulating layer is formed along a side wall of at least one of the normal gate spacers and the dummy gate insulating layer is formed along a side wall of at least one of the dummy gate spacers.

The semiconductor device further comprises a second wire pattern formed on the first wire pattern and extended in the first direction, wherein the normal gate covers the second wire pattern.

In an exemplary embodiment of the present inventive concept, there is provided a semiconductor device, comprising: first and second active regions spaced apart from each other in a first direction with a field insulating layer interposed therebetween and having respective tops formed on the same plane; a first wire pattern formed on the first active region and extended in the first direction; a second wire pattern formed on the second active region and extended in the first direction, wherein a height of the second wire pattern from the tops of the first and second active regions is substantially the same as that of the first wire pattern; a first normal gate formed on the first active region and extended in a second direction different from the first direction and covering the first wire pattern; a second normal gate formed on the second active region and extended in the second direction and covering the second wire pattern; a first dummy gate having a first part which overlaps a first end of the field insulating layer and a second part which overlaps the first active region, wherein the first dummy gate is formed on the first active region and spaced apart from the first normal gate in the first direction; and a second dummy gate having a first part which overlaps a second end of the field insulating layer and a second part which overlaps the second active region, wherein the second dummy gate is formed on the second active region and spaced apart from the second normal gate in the first direction, wherein the first wire pattern penetrates a third part of the first dummy gate and the first dummy gate covers a first end of the first wire pattern, and the second wire pattern penetrates a third part of the second dummy gate and the second dummy gate covers a first end of the second wire pattern.

The semiconductor device further comprises a first normal gate insulating layer formed along a circumference of the first wire pattern and a first side wall of the first normal gate; and a second normal gate insulating layer formed along a circumference of the second wire pattern and a first side wall of the second normal gate.

The semiconductor device further comprises a first dummy gate insulating layer formed along a circumference of the first end of the first wire pattern, a cross-section at an end point of the first end of the first wire pattern, and a first side wall of the first dummy gate; and a second dummy gate insulating layer formed along a circumference of the first end of the second wire pattern, a cross-section at an end point of the first end of the second wire pattern, and a first side wall of the second dummy gate.

The semiconductor device further comprises a first source or drain disposed at first and second sides of the first normal gate; and a second source or drain disposed at first and second sides of the second normal gate, wherein the first source or drain includes a first epitaxial layer and the second source or drain includes a second epitaxial layer.

The semiconductor device further comprises first dummy gate spacers formed at the first side wall and a second side wall of the first dummy gate; and second dummy gate spacers formed at the first side wall and a second side wall of the second dummy gate, wherein the first dummy gate insulating layer is formed along a side wall of at least one of the first dummy gate spacers and the second dummy gate insulating layer is formed along a side wall of at least one of the second dummy gate spacers.

The semiconductor device further comprises first normal gate spacers formed at the first side wall and a second side wall of the first normal gate; and second normal gate spacers formed at the first side wall and a second side wall of the second normal gate, wherein the first normal gate insulating layer is formed along a side wall of at least one of the first normal gate spacers and the second normal gate insulating layer is formed along a side wall of at least one of the second normal gate spacers.

The semiconductor device further comprises a third wire pattern formed on the first wire pattern and extended in the first direction; and a fourth wire pattern formed on the second wire pattern and extended in the first direction, wherein the first normal gate covers the third wire pattern and the second normal gate covers the fourth wire pattern.

A height of the third wire pattern is substantially the same as that of the fourth wire pattern from the tops of the first and second active regions.

The semiconductor device further comprises a fifth wire pattern formed on the third wire pattern and extended in the first direction, wherein the first normal gate covers the fifth wire pattern, and a height of the fifth wire pattern is larger than that of the fourth wire pattern from the tops of the first and second active regions.

The first and second wire patterns include different materials.

The first active region is a p-channel field effect transistor (PFET) formation region and the second active region is an n-channel field effect transistor (NFET) formation region, and the first wire pattern includes SiGe or Ge and the second wire pattern includes Si or III-V-based compound semiconductors.

In an exemplary embodiment of the present inventive concept, there is provided a semiconductor device, comprising: a source or drain region formed on a substrate; a normal gate and a dummy gate formed on the substrate and spaced apart from each other in a first direction with the source or drain region interposed therebetween and extended in a second direction crossing the first direction; and a wire pattern which protrudes from first and second sides of the source or drain region in the first direction, wherein a width of a region where the wire pattern and the normal gate overlap each other in the first direction is different from a width of a region where the wire pattern and the dummy gate overlap each other in the first direction.

The width of the region where the wire pattern and the normal gate overlap each other in the first direction is larger than the width of the region where the wire pattern and the dummy gate overlap each other in the first direction.

In an exemplary embodiment of the present inventive concept, there is provided a semiconductor device comprising: a first normal gate disposed on an active region of a substrate; a first dummy gate disposed on the substrate at a first side of the first normal gate; a first source or drain disposed between the first normal gate and the first dummy gate and on the active region; a second dummy gate disposed on the substrate at a second side of the first normal gate; a second source or drain disposed between the first normal gate and the second dummy gate; a first wire pattern covered by the first normal gate, the first dummy gate and the second dummy gate; and a second wire pattern covered by the first normal gate, the first dummy gate and the second dummy gate.

The first and second wire patterns are channel regions.

The second wire pattern is disposed above the first wire pattern.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Figure 1:
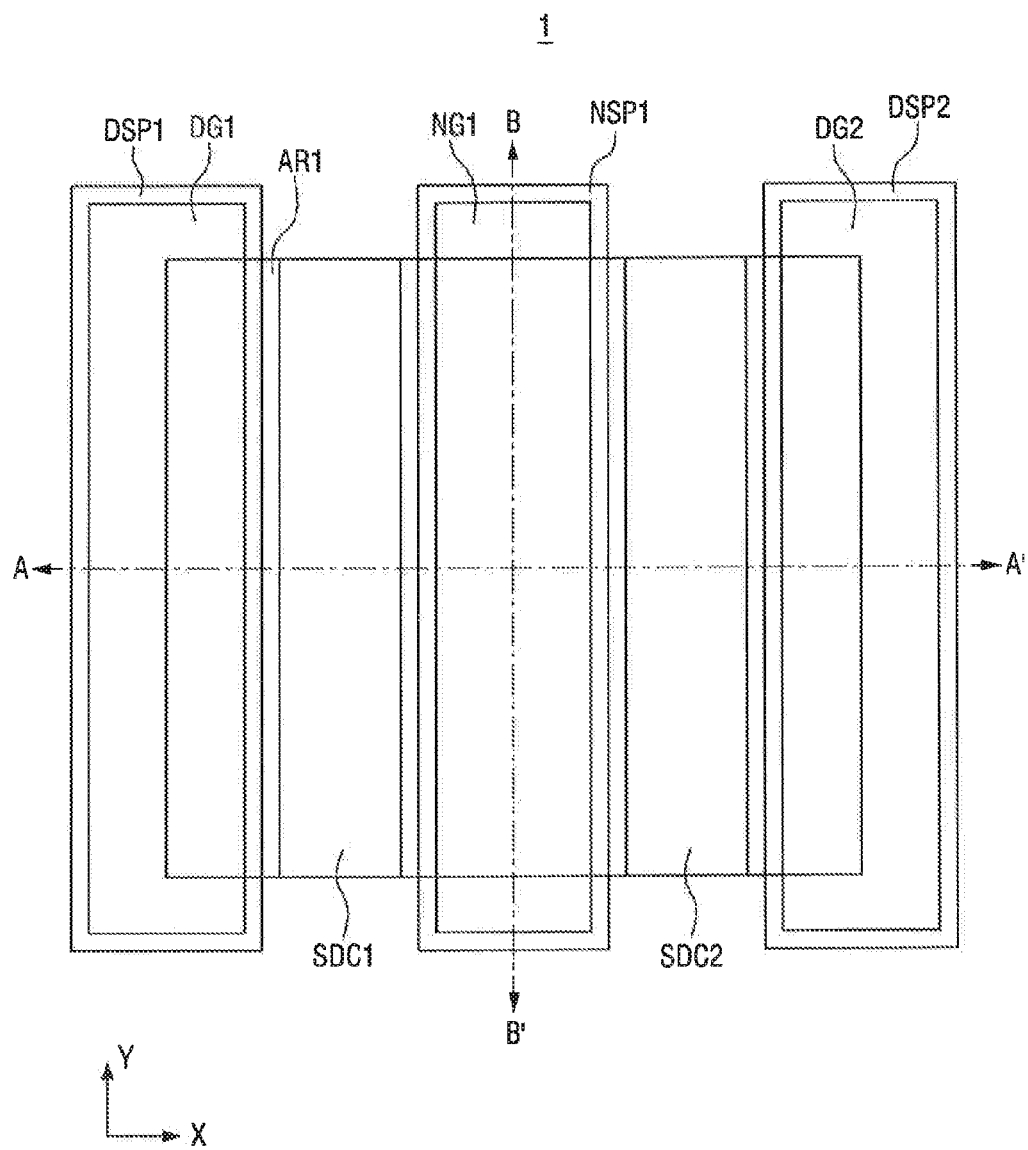
FIG. 1 is a plan view of a semiconductor device according to an exemplary embodiment of the present inventive concept.

Exemplary embodiments of the present inventive concept will now be described more fully hereinafter with reference to the accompanying drawings. The present inventive concept may, however, be embodied in many different forms and should not be construed as being limited to the embodiments set forth herein. Like reference numerals may refer to like elements throughout the specification and drawings.

As used herein, the singular forms "a", "an" and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer or intervening elements or layers may be present.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. In addition, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Hereinafter, a semiconductor device according to an exemplary embodiment of the present inventive concept will be described with reference to FIGS. 1 to 3.

FIG. 1 is a plan view of a semiconductor device according to an exemplary embodiment of the present inventive concept. FIG. 2 is a cross-sectional view taken along line A-A' of FIG. 1. FIG. 3 is a cross-sectional view taken along line B-B' of FIG. 1.

For ease of description, in FIG. 1, first and second interlayer insulating layers ILD1 and ILD2, first and second dummy gate insulating layers DGI1 and DGI2, and a first normal gate insulating layer NGI1 are not illustrated.

Figure 2:
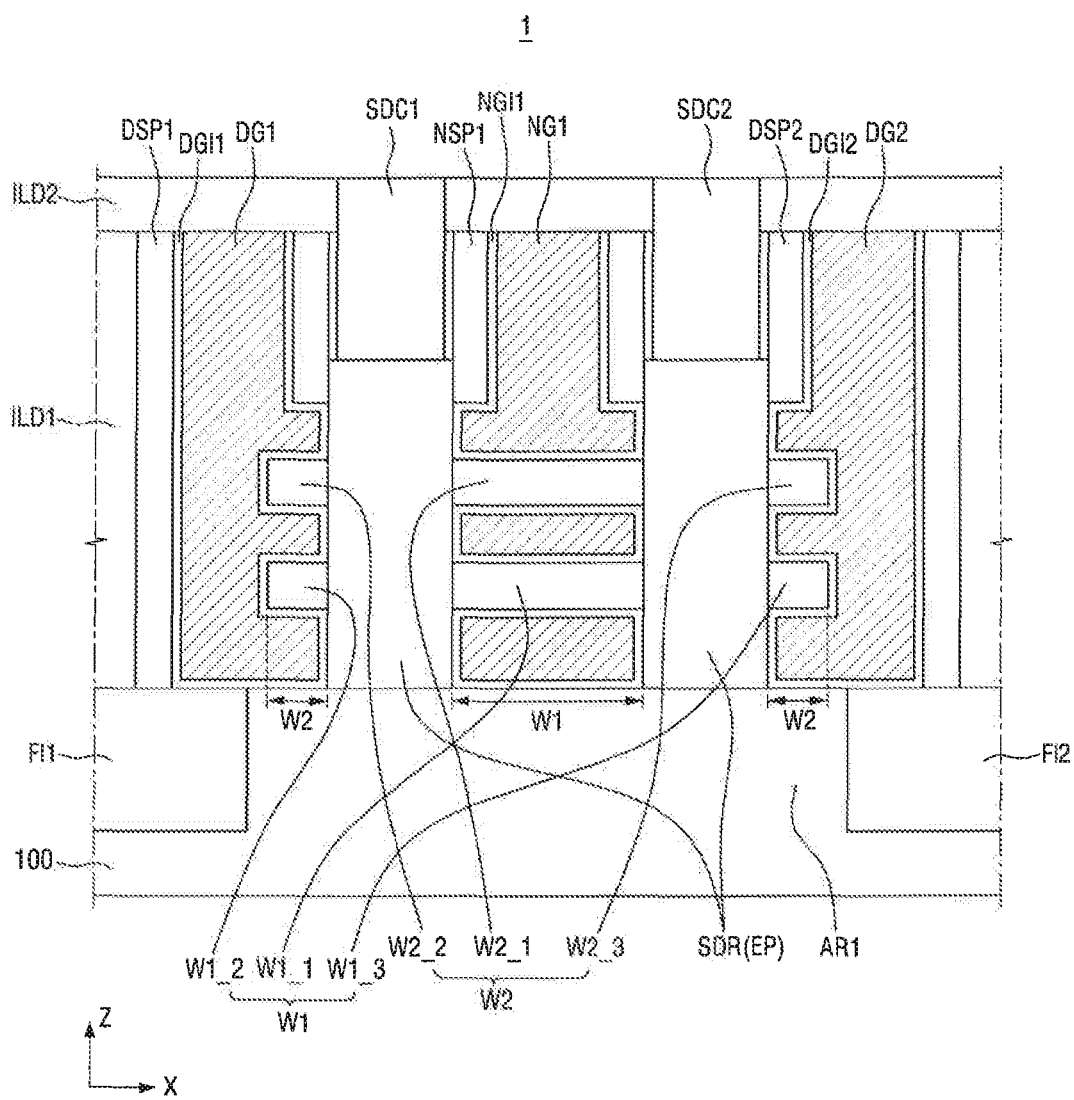
FIG. 2 is a cross-sectional view taken along line A-A' of FIG. 1.
Figure 3:
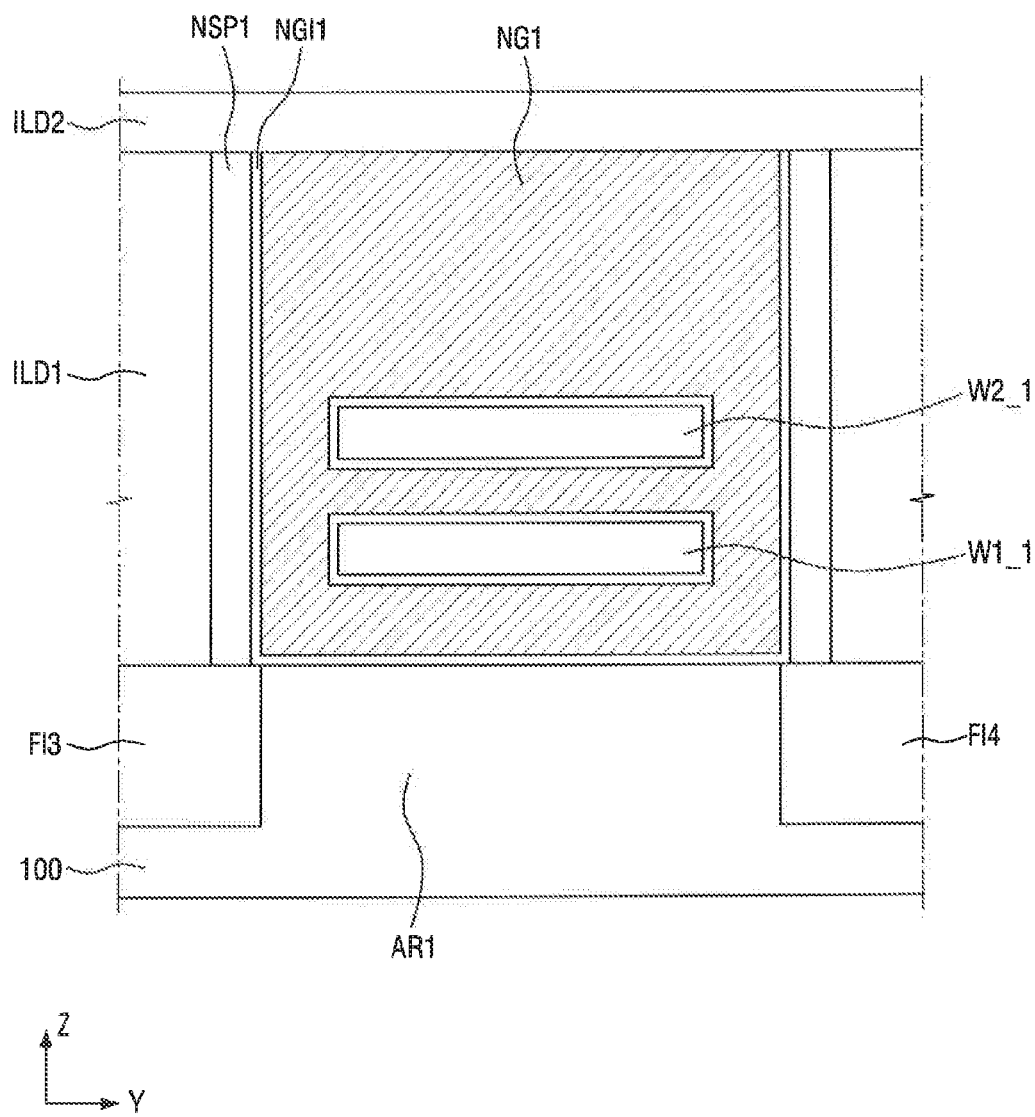
FIG. 3 is a cross-sectional view taken along line B-B' of FIG. 1.

Referring to FIGS. 1 to 3, the semiconductor device 1 according to the current embodiment of the present inventive concept may include a substrate 100, a first wire pattern W1, a second wire pattern W2, a first normal gate NG1, first and second dummy gates DG1 and DG2, a first normal gate spacer NSP1, first and second dummy gate spacers DSP1 and DSP2, a first normal gate insulating layer NGI1, first and second dummy gate insulating layers DGI1 and DGI2, a source or drain SDR, first and second interlayer insulating layers ILD1 and ILD2, and first to fourth field insulating layers FI1 to FI4.

Herein, the semiconductor device 1 according to the current embodiment of the present inventive concept includes the first and second wire patterns W1 and W2 as an example, but the present inventive concept is not limited thereto. In other words, the semiconductor device 1 may include one wire pattern or three or more wire patterns.

The substrate 100 may be, for example, bulk silicon. In addition, the substrate 100 may be a silicon substrate or may include another material, for example, silicon germanium, antimony indium, a lead tellurium compound, indium arsenic, indium phosphide, gallium arsenide, or antimony gallium. Further, in the substrate 100, an epitaxial layer may be formed on a base substrate.

Further, the substrate 100 may include a first active region AR1. The first active region AR1 may be formed to protrude from the substrate 100 and the first active region AR1 may include the same material as the substrate 100.

The first wire pattern W1 extends in a first direction X1 on the first active region AR1. Further, the first wire pattern W1 may include a part W1_1 covered by the first normal gate NG1 and parts W1_2 and W1_3 covered by the first and second dummy gates DG1 and DG2. Herein, a first-direction (X) width of the part W1_1 of the first wire pattern W1 covered by the first normal gate NG1 is a first width W1 and a first-direction (X) width of the parts W1_2 and W1_3 of the first wire pattern W1 covered by the first and second dummy gates DG1 and DG2 is a second width W2. The first width W1 and the second width W2 may be different from each other.

In other words, a first-direction (X) width of a region where the first wire pattern W1 and the first normal gate NG1 overlap with each other is the first width W1 and a first-direction (X) width of a region where the first wire pattern W1 and the first and second dummy gates DG1 and DG2 overlap with each other is the second width W2. Further, the first width W1 may be larger than the second width W2. Here, the first and second dummy gates DG1 and DG2 may cover both ends of the first wire pattern W1.

In other words, the first wire pattern W1 may penetrate a part of each of the first and second dummy gates DG1 and DG2, and the first dummy gate DG1 may cover one end of the first wire pattern W1 and the second dummy gate DG2 may cover the other end of the first wire pattern W1. Here, "that the first wire pattern W1 penetrates a part of each of the first and second dummy gates DG1 and DG2" may mean that the first wire pattern W1 is inserted into predetermined regions in the first and second dummy gates DG1 and DG2.

Further, the part W1_1 of the first wire pattern W1 covered by the first normal gate NG1 is surrounded by the source or drain SDR and the first normal gate insulating layer NGI1 and the parts W1_2 and W1_3 of the first wire pattern W1 covered by the first and second dummy gates DG1 and DG2 may be surrounded by the source or drain SDR and the first and second dummy gate insulating layers DGI1 and DGI2.

The second wire pattern W2 extends in the first direction X1 on the first active region AR1. In other words, the second wire pattern W2 may be formed on the first wire pattern W1. Further, the second wire pattern W2 may include a part W2_1 covered by the first normal gate NG1 and parts W2_2 and W2_3 covered by the first and second dummy gates DG1 and DG2. Herein, a first-direction (X) width of the part W2_1 of the second wire pattern W2 covered by the first normal gate NG1 is the first width W1 and a first-direction (X) width of the parts W2_2 and W2_3 of the second wire pattern W2 covered by the first and second dummy gates DG1 and DG2 is the second width W2. The first width W1 and the second width W2 may be different from each other.

In other words, a first-direction (X) width of a region where the second wire pattern W2 and the first normal gate NG1 overlap with each other is the first width W1 and a first-direction (X) width of a region where the second wire pattern W2 and the first and second dummy gates DG1 and DG2 overlap with each other is the second width W2. Further, the first width W1 may be larger than the second width W2. Here, the first and second dummy gates DG1 and DG2 may cover both ends of the second wire pattern W2.

In other words, the second wire pattern W2 may penetrate a part of each of the first and second dummy gates DG1 and DG2, and the first dummy gate DG1 may cover one end of the second wire pattern W2 and the second dummy gate DG2 may cover the other end of the second wire pattern W2. Here, "that the second wire pattern W2 penetrates a part of each of the first and second dummy gates DG1 and DG2" may mean that the second wire pattern W2 is inserted into predetermined regions in the first and second dummy gates DG1 and DG2.

Further, the part W2_1 of the second wire pattern W2 covered by the first normal gate NG1 is surrounded by the source or drain SDR and the first normal gate insulating layer NGI1 and the parts W2_2 and W2_3 of the second wire pattern W2 covered by the first and second dummy gates DG1 and DG2 may be surrounded by the source or drain SDR and the first and second dummy gate insulating layers DGI1 and DGI2.

In other words, a height of the second wire pattern W2 from the top of the first active region AR1, in other words, a third-direction (Z) height is different from that of the first wire pattern W1 but the second wire pattern W2 may have the same first-direction (X) width as the first wire pattern W1.

Further, the second wire pattern W2 may include the same material as the first wire pattern W1, but the present inventive concept is not limited thereto.

In detail, when the semiconductor device 1 includes, for example, a P-type transistor, the first and second wire patterns W1 and W2 included in the P-type transistor may include, for example, a material having high hole mobility. The first and second wire patterns W1 and W2 may include, for example, one of SiGe and Ge, but the present inventive concept is not limited thereto.

In addition, when the semiconductor device 1 includes, for example, an N-type transistor, the first and second wire patterns W1 and W2 included in the N-type transistor may include, for example, a material having high electron mobility. The first and second wire patterns W1 and W2 may include, for example, one of Si and III-V based compound semiconductors, but the present inventive concept is not limited thereto.

The III-V based compound semiconductor may be, for example, one of a binary compound, a ternary compound, or a quaternary compound in which at least one of aluminum (Al), gallium (Ga), and indium (In) as III-based elements and one of phosphorus (P), arsenic (As), and antimony (Sb) as V-based elements are combined.

Further, in FIG. 3, cross-sections of the first and second wire patterns W1 and W2 have a rectangular shape, but the present inventive concept is not limited thereto. In other words, through a trimming process, edges of the first and second wire patterns W1 and W2 may be, rounded.

The first normal gate NG1 extends in a second direction Y on the first active region AR1. The first normal gate NG1 is formed to cover circumferences of the first and second wire patterns W1 and W2 and to be spaced apart from the first active region AR1.

The first normal gate NG1 is also formed in a space between the first wire pattern W1 and the second wire pattern W2 and a space between the first active region AR1 and the second wire pattern W2.

The first and second dummy gates DG1 and DG2 extend in the second direction Y on the first active region AR1. Further, the first and second dummy gates DG1 and DG2 may be positioned at both sides of the first normal gate NG1, respectively, and positioned to be spaced apart from the first normal gate NG1 in the first direction X.

A part of the first dummy gate DG1 may overlap with one end of the first field insulating layer FI1 and the other part of the first dummy gate DG1 may overlap with one end of the first active region AR1. Further, a part of the second dummy gate DG2 may overlap with one end of the second field insulating layer FI2 and the other part of the second dummy gate DG2 may overlap with the other end of the first active region AR1.

The first dummy gate DG1 is formed to cover a circumference of one end of each of the first and second wire patterns W1 and W2 be spaced apart from the first active region AR1 and cover a cross-section of one end of each of the first and second wire patterns W1 and W2. The second dummy gate DG2 is formed to cover a circumference of the other end of each of the first and second wire patterns W1 and W2 be spaced apart from the first active region AR1 and cover a cross-section of the other end of each of the first and second wire patterns W1 and W2. The cross-sections may represent end points of the first and second wire patterns W1 and W2.

Further, each of the first and second dummy gates DG1 and DG2 is formed in the space between the first wire pattern W1 and the second wire pattern W2 and the space between the first active region AR1 and the second wire pattern W2.

Each of the first normal gate NG1 and the first and second dummy gates DG1 and DG2 may include, for example, at least one of TiN, WN, TaN, Ru, TiC, TaC, Ti, Ag, Al, TiAl, TiAlN, TiAlC, TaCN, TaSiN, Mn, Zr, W, and Al. In addition, each of the first normal gate NG1 and the first and second dummy gates DG1 and DG2 may be made of non-metals such as Si, SiGe, or the like. Each of the first normal gate NG1 and the first and second dummy gates DG1 and DG2 may be formed by, for example, a replacement process, but the present inventive concept is not limited thereto.

The first normal gate spacer NSP1 is formed on both side walls of the first normal gate NG1 that extends in the second direction Y. Further, the first normal gate insulating layer NGI1 may be formed along the side wall of the first normal gate spacer NSP1.

The first and second dummy gate spacers DSP1 and DSP2 are formed on both side walls of the first and second dummy gates DG1 and DG2 that extend in the second direction Y, respectively. Further, the first and second dummy gate insulating layers DGI1 and DGI2 may be formed along respective side walls of the first and second dummy gate spacers DSP1 and DSP2.

Each of the first normal gate spacers NSP1 and the first and second dummy gate spacers DSP1 and DSP2 may include, for example, at least one of silicon nitride (SiN), silicon oxynitride (SiON), silicon oxide ($SiO_2$), silicon oxy-carbon nitride (SiOCN), and a combination thereof. Each of the first normal gate spacer NSP1 and the first and second dummy gate spacers DSP1 and DSP2 is illustrated as a single layer, but is not limited thereto and may have a structure of multiple layers.

The first normal gate insulating layer NGI1 may be formed between the first wire pattern W1 and the first normal gate NG1 and between the first wire pattern W1 and the second wire pattern W2. The first normal gate insulating layer NGI1 may be formed between the first normal gate NG1 and the first normal gate spacer NSP1. Further, the first normal gate insulating layer NGI1 may be formed between the first active region AR1 and the first normal gate NG1.

The first normal gate insulating layer NGI1 may be conformally formed along the circumferences of the first and second wire patterns W1 and W2 and the side wall of the first normal gate NG1. In addition, the first normal gate insulating layer NGI1 may be conformally formed along the circumferences of the first and second wire patterns W1 and W2 and the side wall of the first normal gate spacer NSP1. The first normal gate insulating layer NGI1 may be formed on the top of the first active region AR1. Further, the first normal gate insulating layer NGI1 may be formed on a part of a surface of the source or drain SDR.

Since the first normal gate insulating layer NGI1 is formed between the side wall of the first normal gate NG1 and the side wall of the first normal gate spacer NSP1, one surface of the first normal gate insulating layer NGI1 is formed along the side wall of the first normal gate NG1 and the other surface of the first normal gate insulating layer NGI1 is formed along the side wall of the first normal gate spacer NSP1.

The first dummy gate insulating layer DGI1 may be formed between the first wire pattern W1 and the first dummy gate DGI1 and between the first wire pattern W1 and the second wire pattern W2. The first dummy gate insulating layer DGI1 may be formed between the first dummy gate DG1 and the first dummy gate spacer DSP1. Further, the first dummy gate insulating layer DGI1 may be formed between the first active region AR1 and the first dummy gate DG1.

The first dummy gate insulating layer DGI1 may be conformally formed along the circumference and the cross-section of one end of each of the first and second wire patterns W1 and W2 and the side wall of the first dummy gate DG1. In addition, the first dummy gate insulating layer DGI1 may be conformally formed along the circumference and the cross-section of one end of each of the first and second wire patterns W1 and W2 and the side wall of the first dummy gate spacer DSP1. The first dummy gate insulating layer DGI1 may be formed on the top of the first field insulating layer FI1 and the top of the first active region AR1. Further, the first dummy gate insulating layer DGI1 may be formed on a part of a surface of the source or drain SDR.

Since the first dummy gate insulating layer DGI1 is formed between the side wall of the first dummy gate DG1 and the side wall of the first dummy gate spacer DSP1, one surface of the first dummy gate insulating layer DGI1 is formed along the side wall of the first dummy gate DG1 and the other surface of the first dummy gate insulating layer DGI1 is formed along the side wall of the first dummy gate spacer DSP1.

The second dummy gate insulating layer DGI2 may be formed between the first wire pattern W1 and the second dummy gate DG2 and between the first wire pattern W1 and the second wire pattern W2. The second dummy gate insulating layer DGI2 may be formed between the second dummy gate DG2 and the second dummy gate spacer DSP2. Further, the second dummy gate insulating layer DGI2 may be formed between the first active region AR1 and the second dummy gate DG2.

The second dummy gate insulating layer DGI2 may be conformally formed along the circumference and the cross-section of the other end of each of the first and second wire patterns W1 and W2 and the side wall of the second dummy gate DG2. In addition, the second dummy gate insulating layer DGI2 may be conformally formed along the circumference and the cross-section of the other end of each of the first and second wire patterns W1 and W2 and the side wall of the second dummy gate spacer DSP2. The second dummy gate insulating layer DGI2 may be formed on the top of the second field insulating layer FI2 and the top of the first active region AR1. Further, the second dummy gate insulating layer DGI2 may be formed on a part of a surface of the source or drain SDR.

Since the second dummy gate insulating layer DGI2 is formed between the side wall of the second dummy gate DG2 and the side wall of the second dummy gate spacer DSP2, one surface of the second dummy gate insulating layer DGI2 is formed along the side wall of the second dummy gate DG2 and the other surface of the second dummy gate insulating layer DGI2 is formed along the side wall of the second dummy gate spacer DSP2.

Each of the first normal gate insulating layer NGI1 and the first and second dummy gate insulating layers DGI1 and DGI2 may include a high dielectric material having a larger dielectric constant than a silicon oxide film. For example, each of the first normal gate insulating layer NGI1 and the first and second dummy gate insulating layers DGI1 and DGI2 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The sources or drains SDR are disposed at both sides of the first normal gate NG1. In other words, the source or drain SDR may be formed between the first normal gate NG1 and the first dummy gate DG1 and between the first normal gate NG1 and the second dummy gate DG2. Further, the source or drain SDR is formed on the first active region AR1 and connected with the first and second wire patterns W1 and W2 which are channel regions.

The source or drain SDR may include an epitaxial layer EP on the first active region AR1.

The epitaxial layer EP may include a first part connected with the first wire pattern W1 and a second part that contacts the first normal gate insulating layer NGI1 and the first and second dummy gate insulating layers DGI1 and DGI2. Here, the first part may be directly connected with, for example, the first wire pattern W1, but the present inventive concept is not limited thereto.

An outer peripheral surface of the epitaxial layer EP may have various shapes. For example, the outer peripheral surface of the epitaxial layer EP may have at least one of a diamond shape, a circular shape, and a rectangular shape.

The epitaxial layer EP may include, for example, a material that may apply compression stress to the first and second wire patterns W1 and W2 used as channel regions of PMOS. The epitaxial layer EP may include a material having a larger lattice constant than the first and second wire patterns W1 and W2. When the first and second wire patterns W1 and W2 include SiGe, the epitaxial layer EP may include SiGe having a higher content of Ge than that of the first and second wire patterns W1 and W2.

Further, the epitaxial layer EP may include, for example, a material that may apply tensile stress to the first and second wire patterns W1 and W2 used as channel regions of NMOS, or the same material as the first and second wire patterns W1 and W2. The epitaxial layer EP may include a material having a smaller or the same lattice constant as that of the first and second wire patterns W1 and W2. When the first and second wire patterns W1 and W2 is made of Si, the epitaxial layer EP may be made of Si or a material (for example, SiC) having a smaller lattice constant than Si.

First and second source or drain contacts SDC1 and SDC2 are formed on the source or drain SDR.

The second interlayer insulating layer ILD2 may be formed on the first interlayer insulating layer ILD1. Further, the first interlayer insulating layer ILD1 may be formed on the first to fourth field insulating layers FI1 to FI4 to cover the first normal gate NG1 and the first and second dummy gates DG1 and DG2.

Further, the first and second interlayer insulating layers ILD1 and ILD2 may include at least one of a low-dielectric material, an oxide film, a nitride film, and an oxy-nitride film. The low-dielectric material may include, for example, flow-able oxide (FOX), tonen silaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable chemical vapor deposition (FCVD) oxide or combinations thereof.

The first to fourth field insulating layers FI1 to FI4 are formed on the substrate 100.

In detail, the first to fourth field insulating layers FI1 to FI4 may be element separation layers that separate the active regions formed on the substrate 100 and the first interlayer insulating layer ILD1 may be formed on the first to fourth field insulating layers FI1 to FI4.

Further, the first to fourth field insulating layers FI1 to FI4 may be made of a material including at least one of the silicon oxide film, the silicon nitride film, and the silicon oxy-nitride film, but is not limited thereto.

The semiconductor device 1 according to the current embodiment of the present inventive concept includes the first normal gate NG1 and the first and second dummy gates DG1 and DG2 that cover all four surfaces of the first and second wire patterns W1 and W2 which are the channel regions and can improve a current control capability without increasing the length of the gate (e.g., the normal gate or the dummy gate) and effectively suppress a short channel effect (SCE) in which a potential of the channel region is influenced by a drain voltage. Further, the first active region AR1 is not separated by a fin shape and instead has a continuous plane. This way, a constraint condition, for example, that a standard cell should be designed by taking into account separation distances in the fin shape, does not apply. As a result, the standard cell using the current embodiment of the present inventive concept may be designed with a high degree of freedom.

Hereinafter, a semiconductor device according to an exemplary embodiment of the present inventive concept will be described with reference to FIG. 4. A difference from the semiconductor device 1 shown in FIGS. 1 to 3 will be primarily described. The remaining elements shown in FIG. 4 correspond to those already described with reference to FIGS. 1 to 3 and thus will not be described.

Figure 4:
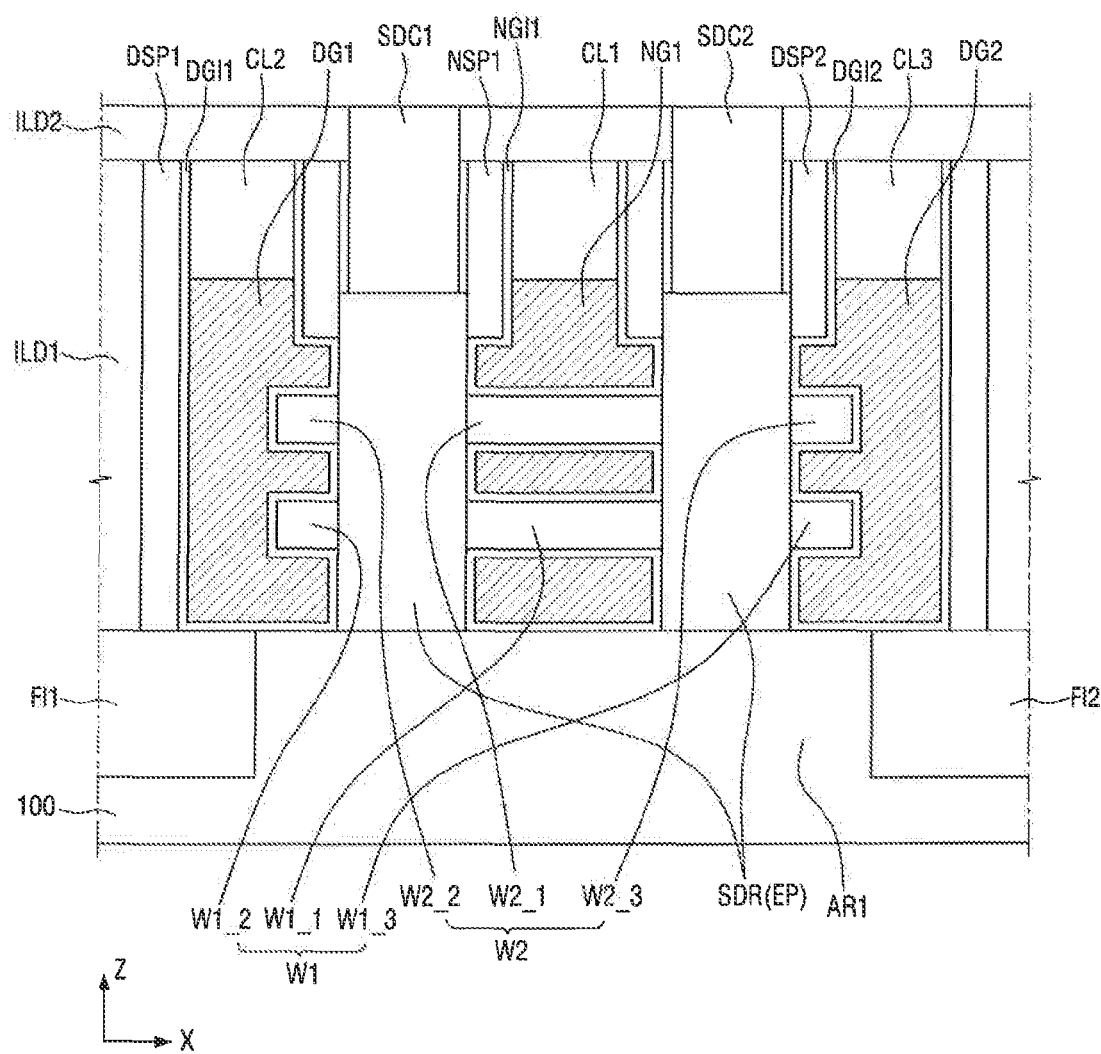
FIG. 4 is a cross-sectional view of a semiconductor device according to an exemplary embodiment of the present inventive concept.

FIG. 4 is a cross-sectional view of a semiconductor device according to an exemplary embodiment of the present inventive concept.

Unlike the semiconductor device 1 of FIG. 2, in a semiconductor device 2 of FIG. 4, the tops of the first normal gate NG1 and the first and second dummy gates DG1 and DG2 are partially etched and first to third capping layers CL1 to CL3 are formed at the etched portions.

Herein, the first capping layer CL1 may be formed above the first normal gate NG1, and the second and third capping layers CL2 and CL3 may be formed above the first and second dummy gates DG1 and DG2, respectively. Further, the first to third capping layers CL1 to CL3 may include, for example, SiN, but are not limited thereto.

The second interlayer insulating layer ILD2 may be formed on the first to third capping layers CL1 to CL3 and the first to third capping layers CL1 to CL3 may be covered by the second interlayer insulating layer ILD2.

A manufacturing process of the first to third capping layers CL1 to CL3 will be described later.

Hereinafter, a semiconductor device according to an exemplary embodiment of the present inventive concept will be described with reference to FIG. 5. A difference from the semiconductor device 1 shown in FIGS. 1 to 3 will be primarily described. The remaining elements shown in FIG. 5 correspond to those already described with reference to FIGS. 1 to 3 and thus will not be described.

Figure 5:
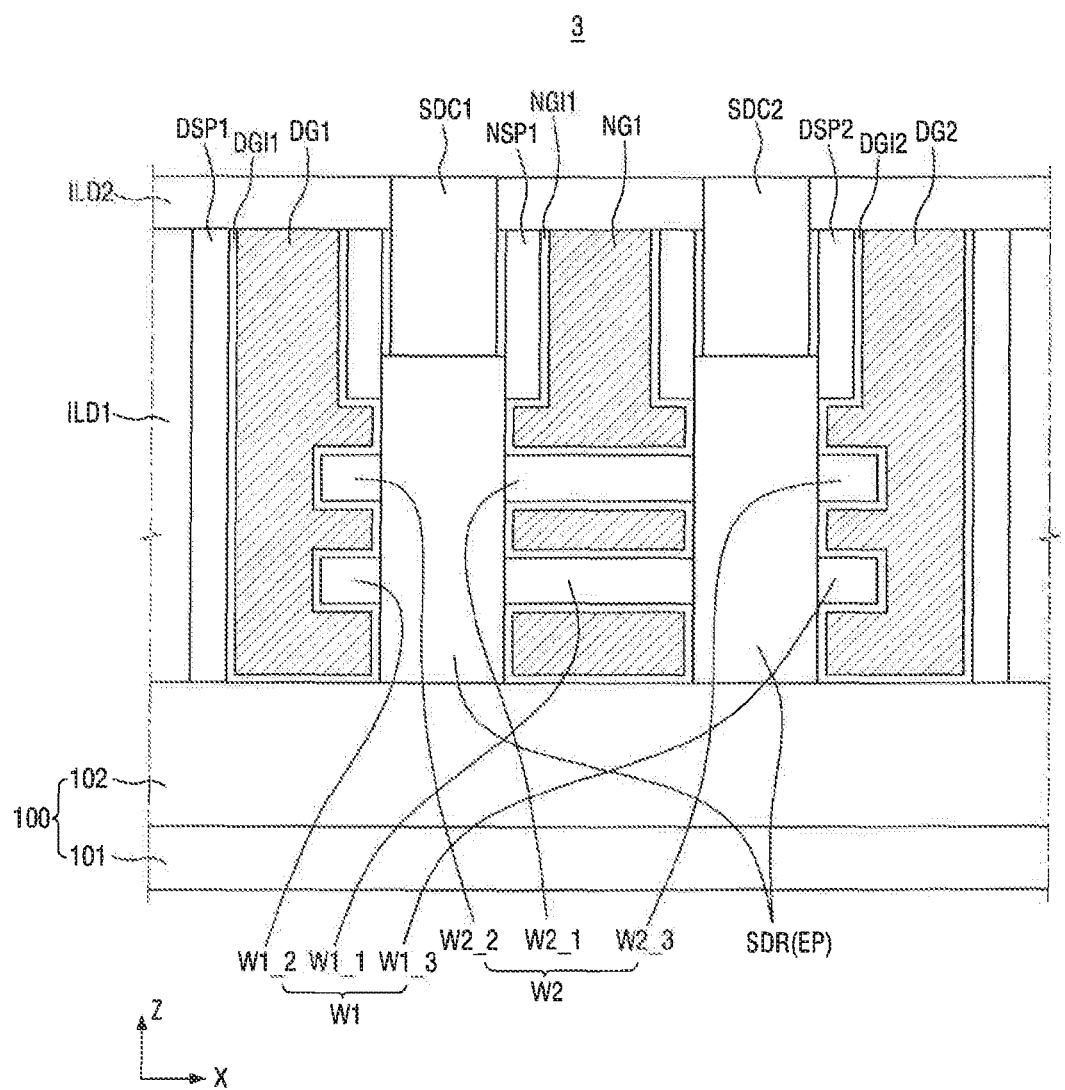
FIG. 5 is a cross-sectional view of a semiconductor device according to an exemplary embodiment of the present inventive concept.

FIG. 5 is a cross-sectional view of the semiconductor device according to the current embodiment of the present inventive concept.

In a semiconductor device 3 of FIG. 5, the substrate 100 may include a lower substrate 101 and an upper substrate 102 formed on one surface of the lower substrate 101, unlike the semiconductor device 1 of FIG. 2. For example, the lower substrate 101 may be a semiconductor substrate and the upper substrate 102 may be an insulating layer substrate. In other words, the substrate 100 may include the semiconductor substrate and the insulating layer substrate formed on one surface of the semiconductor substrate and may be, for example, a silicon-on-insulator (SOI).

Hereinafter, a semiconductor device according to an exemplary embodiment of the present inventive concept will be described with reference to FIGS. 6 and 7. A difference from the semiconductor device 1 shown in FIGS. 1 to 3 will be primarily described.

Figure 6:
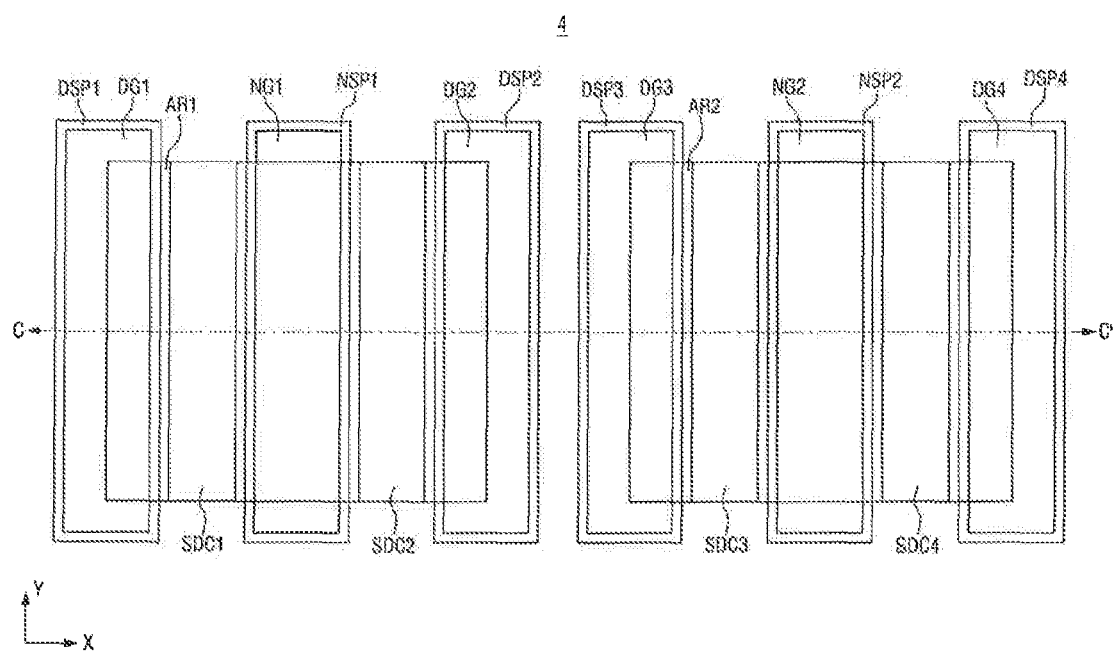
FIG. 6 is a plan view of a semiconductor device according to an exemplary embodiment of the present inventive concept.

FIG. 6 is a plan view of the semiconductor device according to the current embodiment of the present inventive concept. FIG. 7 is a cross-sectional view taken along line C-C' of FIG. 6.

Figure 7:
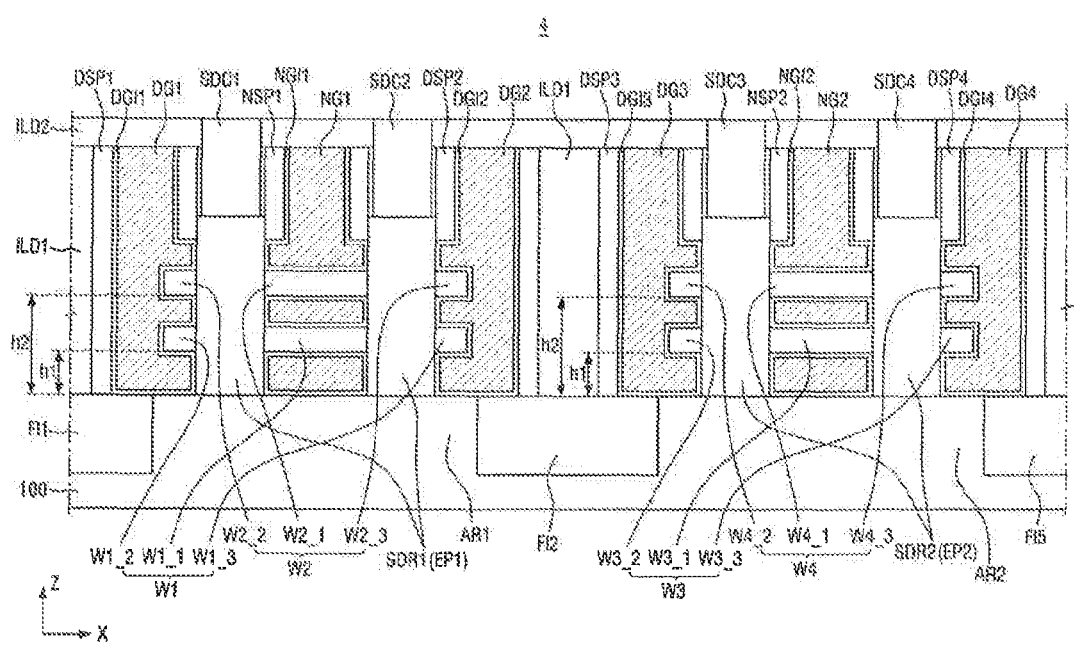
FIG. 7 is a cross-sectional view taken along line C-C' of FIG. 6.

Referring to FIGS. 6 and 7, the substrate 100 may include first and second active regions AR1 and AR2 separated in the first direction X with the second field insulating layer FI2 interposed therebetween, unlike the semiconductor device 1 of FIG. 2. Here, the tops of the first and second active regions AR1 and AR2 may be formed on the same plane. Here, the term "same" may mean "about the same" when there is an error range due to a manufacturing process in addition to meaning "completely the same".

The first and second wire patterns W1 and W2 may be formed on the first active region AR1 and third and fourth wire patterns W3 and W4 may be formed on the second active region AR2.

Herein, from the top of the first active region AR1, a height of the first wire pattern W1 is a first height h1 and a height of the second wire pattern W2 is a second height h2. Further, from the top of the second active region AR2, a height of the third wire pattern W3 is a first height h1 and a height of the fourth wire pattern W4 is a second height h2. In other words, third-direction (Z) heights of the first and third wire pattern W1 and W3 from the tops of the first and second active regions AR1 and AR2 may be the same as the first height h1 and third-direction (Z) heights of the second and fourth wire patterns W2 and W4 from the tops of the first and second active regions AR1 and AR2 may be the same as the second height h2. Herein, the second height h2 is larger than the first height h1.

The first and second dummy gates DG1 and DG2 may be formed at both sides of the first normal gate NG1, respectively, and be spaced apart from the first normal gate NG1 in the first direction X. The third and fourth dummy gates DG3 and DG4 may be formed at both sides of the second normal gate NG2, respectively, and be spaced apart from the second normal gate NG2 in the first direction X.

Here, a part of the second dummy gate DG2 may overlap with one end of the second field insulating layer FI2 and another part of the second dummy gate DG2 may overlap with the first active region AR1. Further, a part of the third dummy gate DG3 may overlap with the other end of the second field insulating layer FI2 and another part of the third dummy gate DG3 may overlap with the second active region AR2.

Further, the first interlayer insulating layer ILD1 may separate the transistors formed on the respective active regions and, in more detail, the first interlayer insulating layer ILD1 may separate the transistor on the first active region AR1 and the transistor on the second active region AR2 from each other. Here, the transistor on the first active region AR1 may include, for example, the first and second wire patterns W1 and W2, the first normal gate NG1, the first and second dummy gates DG1 and DG2, the first normal gate insulating layer NGI1, the first and second dummy gate insulating layers DGI1 and DGI2, the first normal gate spacer NSP1, the first and second dummy gate spacers DSP1 and DSP2, and a first source or drain SDR1. Further, the transistor on the second active region AR2 may include, for example, the third and fourth wire patterns W3 and W4, the second normal gate NG2, the third and fourth dummy gates DG3 and DG4, the second normal gate insulating layer NGI2, the third and fourth dummy gate insulating layers DGI3 and DGI4, the second normal gate spacer NSP2, the third and fourth dummy gate spacers DSP3 and DSP4, and a second source or drain SDR2.

The transistor on the first active region AR1 may be, for example, a P-type transistor and the transistor on the second active region AR2 may be, for example, an N-type transistor.

In addition, the first and second wire patterns W1 and W2 may include, for example, a material having high hole mobility. The first and second wire patterns W1 and W2 may include, for example, one of SiGe and Ge, but the present inventive concept is not limited thereto. Further, the third and fourth wire patterns W3 and W4 may include, for example, a material having high electron mobility. The third and fourth wire patterns W3 and W4 may include, for example, one of Si and III-V based compound semiconductors, but the present inventive concept is not limited thereto.

First and second source or drain contacts SDC1 and SDC2 are formed on the first source or drain SDR1 and third and fourth source or drain contacts SDC3 and SDC4 are formed on the second source or drain SDR2. A fifth field insulating layer FI5 is further shown below the fourth dummy gate DG4.

Additionally, the first source or drain SDR1 may include the first epitaxial layer EP1 and the first epitaxial layer EP1 may include a material that may apply compression stress to the first and second wire patterns W1 and W2 used as the channel regions of the PMOS. The first epitaxial layer EP1 may include a material having a larger lattice constant than the first and second wire patterns W1 and W2. When the first and second wire patterns W1 and W2 include SiGe, the first epitaxial layer EP1 may include SiGe having a higher content of Ge than that of the first and second wire patterns W1 and W2. Further, the second source or drain SDR2 may include the second epitaxial layer EP2 and the second epitaxial layer EP2 may include a material that may apply tension stress to the third and fourth wire patterns W3 and W4 used as the channel regions of the NMOS and the same material as that of the third and fourth wire patterns W3 and W4. The second epitaxial layer EP2 may include a material having a smaller lattice constant than or the same material as that of the third and fourth wire patterns W3 and W4. When the third and fourth wire patterns W3 and W4 are made of Si, the second epitaxial layer EP2 may be made of Si or a material (for example, SiC) having a smaller lattice constant than that of Si.

Hereinafter, a semiconductor device according to an exemplary embodiment of the present inventive concept will be described with reference to FIG. 8. A difference from the semiconductor device 4 shown in FIGS. 6 and 7 will be primarily described. The remaining elements shown in FIG. 8 correspond to those already described with reference to FIGS. 6 and 7 and thus will not be described.

Figure 8:
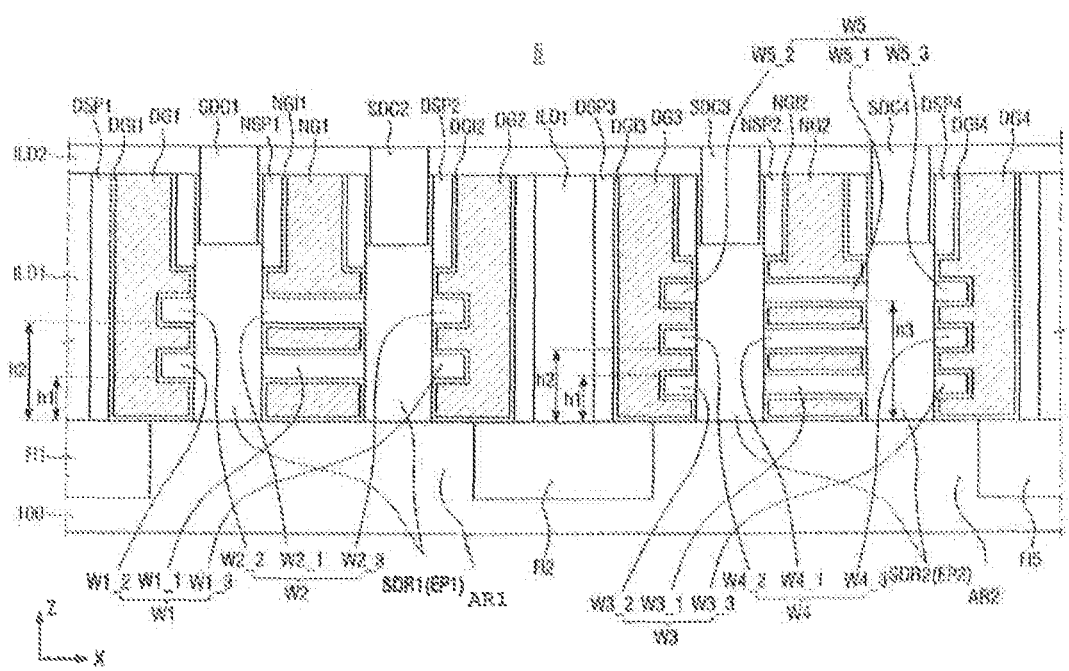
FIG. 8 is a cross-sectional view of a semiconductor device according to an exemplary embodiment of the present inventive concept.

FIG. 8 is a cross-sectional view of the semiconductor device according to the current embodiment of the present invention.

Unlike the semiconductor device 4 of FIG. 7, in the semiconductor device 5 of FIG. 8, three wire patterns are formed on the second active region AR2. In other words, two wire patterns (the first and second wire patterns W1 and W2) may be formed on the first active region AR1 and three wire patterns (the third to fifth wire patterns W3 to W5) may be formed on the second active region AR2.

In other words, the transistor on the first active region AR1 and the transistor on the second active region AR2 may have a different number of wire patterns.

Further, the third-direction (Z) height of the fifth wire pattern W5 from the top of the second active region AR2 is a third height h3 which may be larger than the first and second heights h1 and h2.

Hereinafter, a semiconductor device according to an exemplary embodiment of the present inventive concept will be described with reference to FIGS. 9 and 10. A difference from the semiconductor device 4 shown in FIGS. 6 and 7 will be primarily described. The remaining elements shown in FIGS. 9 and 10 that correspond to those already described with reference to FIGS. 6 and 7 will not be described.

Figure 9:
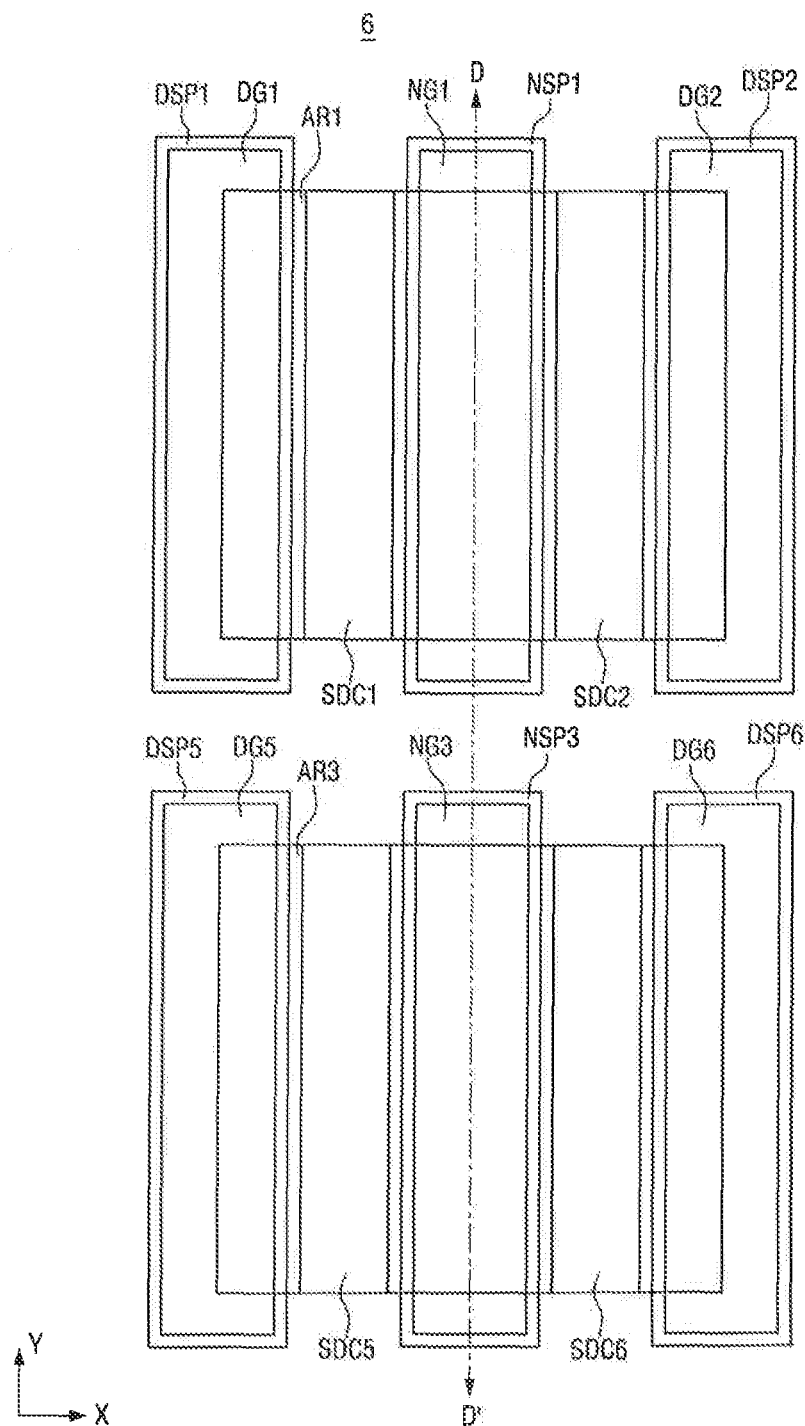
FIG. 9 is a plan view of a semiconductor device according to an exemplary embodiment of the present inventive concept.

FIG. 9 is a plan view of a semiconductor device according to the current embodiment of the present inventive concept. FIG. 10 is a cross-sectional view taken along line D-D' of FIG. 9.

Referring to FIG. 9, it can be seen that the active regions are disposed to be spaced apart in the second direction Y, unlike the active regions of FIG. 6.

In other words, the first active region AR1 and the third active region AR3 may be disposed to be spaced apart in the second direction Y. Further, in the third active region AR3, fifth and sixth source or drain contacts SDC5 and SDC6 are formed on the source or drain SDR.

FIG. 9 further shows fifth and sixth dummy gates DG5 and DG6 surrounded by fifth and sixth dummy gate spacers DSP5 and DSP6 and a third normal gate NG3 surrounded by a third normal gate spacer NSP3.

Figure 10:
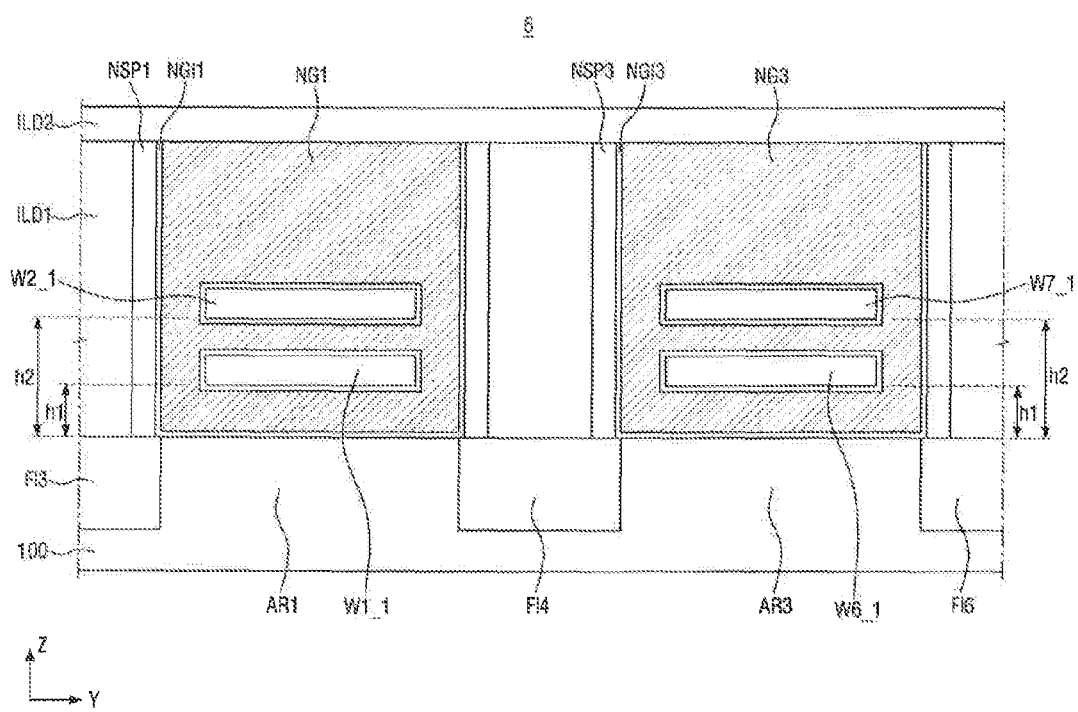
FIG. 10 is a cross-sectional view taken along line D-D' of FIG. 9.

Referring to FIG. 10, the first and third active regions AR1 and AR3 may be formed to be spaced part in the second direction Y around the fourth field insulating layer FI4.

Further, the transistor on the first active region AR1 may be, for example, the P-type transistor and the transistor on the third active region AR3 may be, for example, the N-type transistor.

Additionally, the transistor on the first active region AR1 and the transistor on the third active region AR3 may have the same number of wire patterns. In the third active region AR3, sixth and seventh wire patterns W6_1 and W7_1 are shown as well as a sixth field insulating layer FI6. FIG. 10 further shows a third normal gate insulating layer NG13.

Hereinafter, a semiconductor device according to an exemplary embodiment of the present inventive concept will be described with reference to FIG. 11. A difference from the semiconductor device 6 shown in FIGS. 9 and 10 will be primarily described. The remaining elements shown in FIG. 11 correspond to those already described with reference to FIGS. 9 and 10 and thus will not be described.

Figure 11:
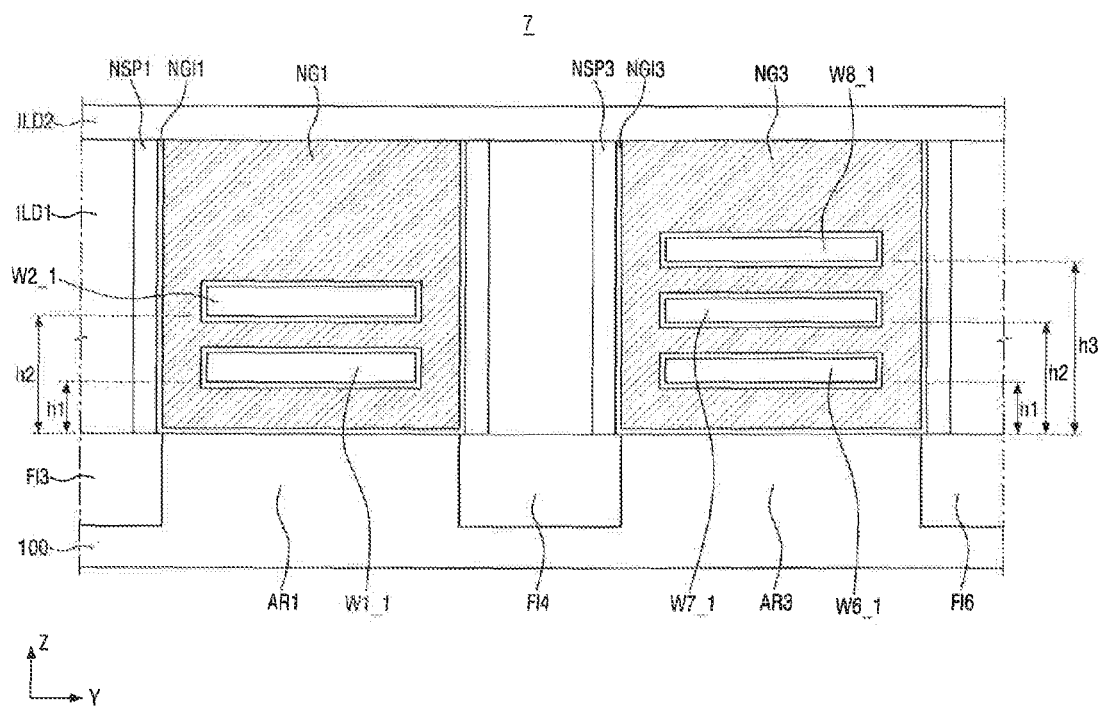
FIG. 11 is a cross-sectional view of a semiconductor device according to an exemplary embodiment of the present inventive concept.

FIG. 11 is a cross-sectional view of the semiconductor device according to the current embodiment of the present inventive concept.

Unlike FIG. 10, in the semiconductor device 7 of FIG. 11, the transistor on the first active region AR1 and the transistor on the third active region AR3 may include a different number of wire patterns.

In other words, the transistor on the first active region AR1 may include, for example, two wire patterns and the transistor on the third active region AR3 may include, for example, three wire patterns. For example, the third active region AR3 includes an extra wire pattern W8_1.

Hereinafter, a manufacturing method of the semiconductor device of FIG. 1 will be described with reference to FIGS. 12 to 22.

FIGS. 12 to 22 are diagrams of steps of a method of manufacturing the semiconductor device of FIG. 1.

Figure 12:
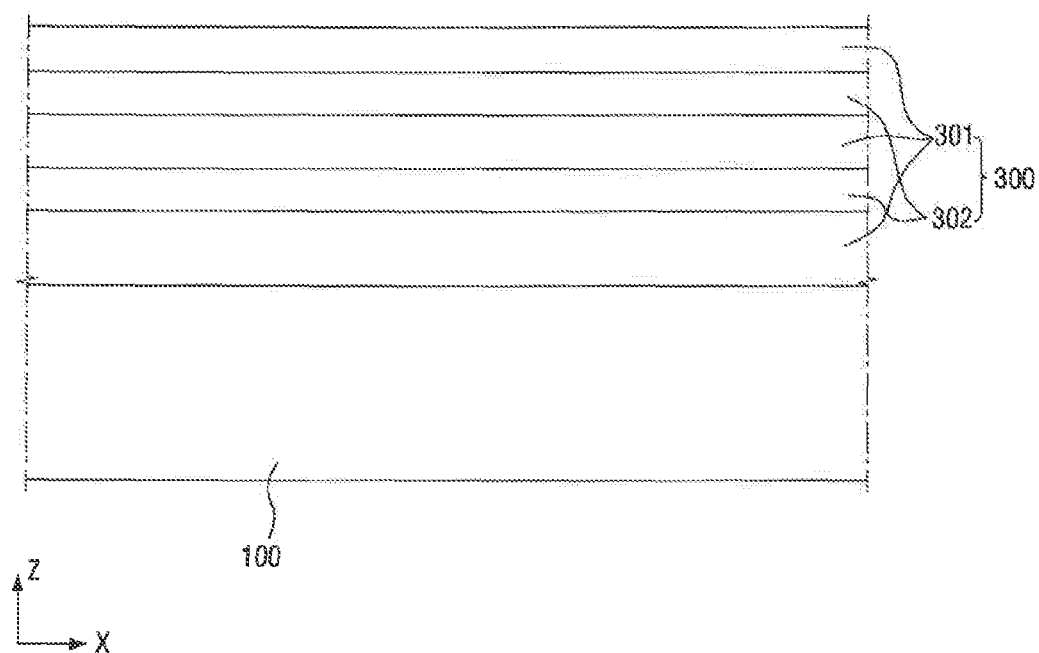
FIGS. 12, 13, 14, 15, 16, 17, 18, 19, 20, 21 and 22 are diagrams of steps of a method of manufacturing the semiconductor device of FIG. 1 according to an exemplary embodiment of the present inventive concept.

First, referring to FIG. 12, a stacking structure 300 in which a first semiconductor layer 301 and a second semiconductor layer 302 are alternately stacked is formed on the substrate 100.

In more detail, the first semiconductor layer 301 contacting the substrate 100 in the stacking structure 300 may be, for example, a layer contacting the substrate 100, through a wafer bonding scheme, and the like, but the present inventive concept is not limited thereto.

The second semiconductor layer 302 and the first semiconductor layer 301 may be alternately formed on the first semiconductor layer 301 contacting the substrate 100. The first semiconductor layer 301 and the second semiconductor layer 302 may be formed by using, for example, an epitaxial growth method, but the present inventive concept is not limited thereto. An uppermost layer of the stacking structure 300 may be, for example, the first semiconductor layer 301, but the present inventive concept is not limited thereto.

The first semiconductor layer 301 and the second semiconductor layer 302 include different materials. The first semiconductor layer 301 and the second semiconductor layer 302 may include materials having different etch selection ratios from each other. The first semiconductor layer 301 may include, for example, one of SiGe and Ge, but the present inventive concept is not limited thereto. The second semiconductor layer 302 may include, for example, one of Si and III-V-based compound semiconductors, but the present inventive concept is not limited thereto.

Subsequently, a first mask pattern 155 of FIG. 13 that extends in the first direction X is formed on the stacking structure 300.

Figure 13:
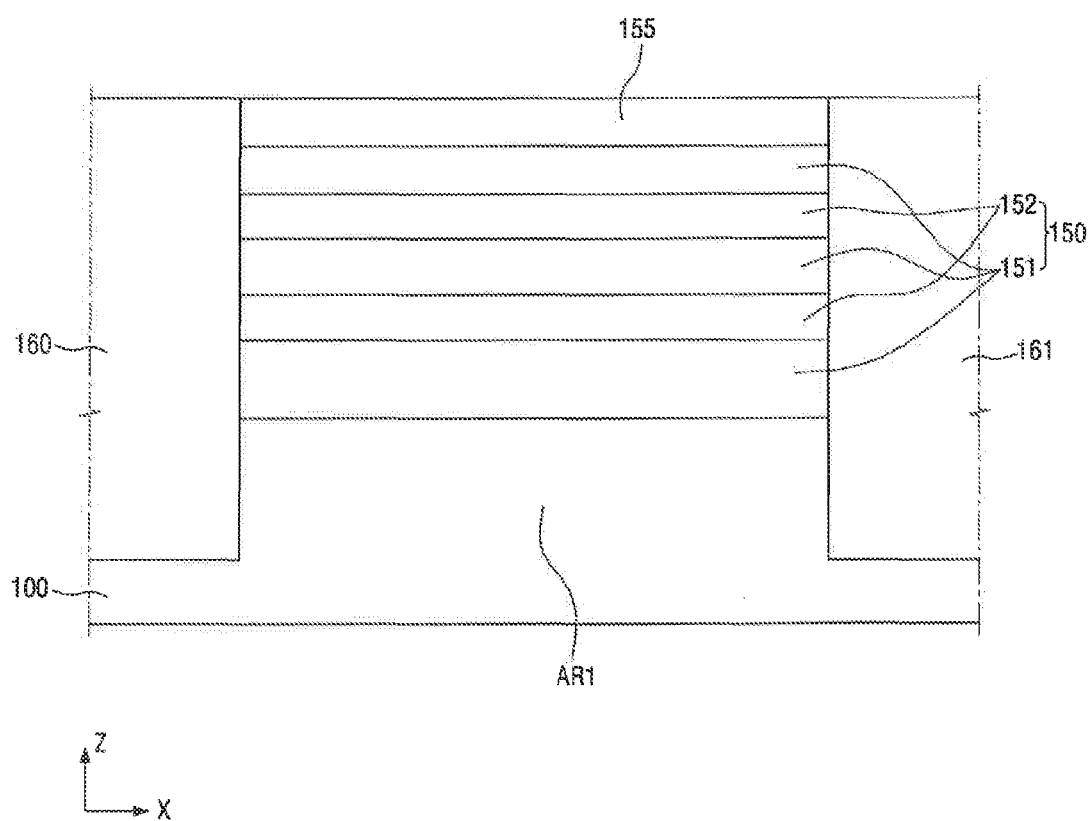

The first mask pattern 155 of FIG. 13 may be made of for example, a material including at least one of the silicon oxide film, the silicon nitride film, and the silicon oxy-nitride film.

Referring to FIG. 13, the stacking structure 300 is etched by using the first mask pattern 155 as a mask to form a semiconductor pattern structure 150. For example, the stacking structure 300 is etched until the top of the substrate 100 is exposed, and as a result, the semiconductor pattern structure 150 may be formed.

The semiconductor pattern structure 150 may extend in the first direction X. Further, the semiconductor pattern structure 150 may include a first semiconductor pattern 151 and a second semiconductor pattern 152 that are alternately stacked on the substrate 100.

Further, at the time of etching the stacking structure 300, a part of the substrate 100 is also etched to form the first active region AR1. In addition, an interlayer insulating layer (not illustrated) is formed to cover the substrate 100 and the first mask pattern 155 and thereafter, a planarizing process is performed until the top of the first mask pattern 155 is exposed, and as a result, interlayer insulating layers 160 and 161 may be formed.

Subsequently, the first mask pattern 155 positioned on the semiconductor pattern structure 150 may be removed.

Figure 14:
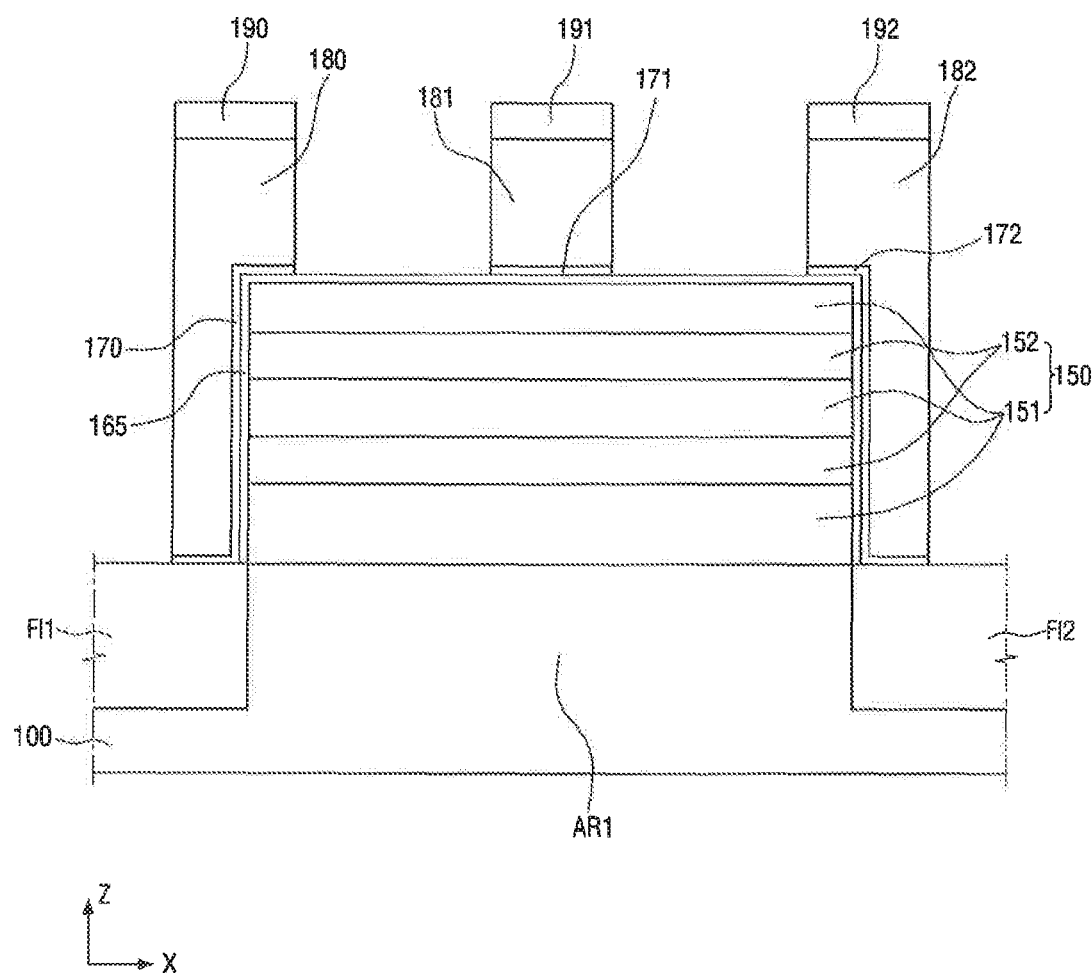

Referring to FIG. 14, an etching process is performed by using second mask patterns 190, 191, and 192 to form gate insulating layers 170, 171, and 172 and gates 180, 181, and 182 that extend in the second direction Y by crossing the semiconductor pattern structure 150. Therefore, the gates 180, 181, and 182 may be formed on the semiconductor pattern structure 150. Further, the gate insulating layers 170, 171, and 172 may be formed along a side wall and the top of the insulating layer 165 and the tops of the first and second field insulating layers FI1 and FI2.

Here, the insulating layer 165 may be formed to cover the semiconductor pattern structure 150 and the insulating layer 165 may be formed between the semiconductor pattern structure 150 and the gate insulating layers 170, 171, and 172. Here, the insulating layer 165 may be, for example, an oxide film and in more detail, may include $SiO_2$, but the present inventive concept is not limited thereto.

The gate insulating layers 170, 171, and 172 may be the silicon oxide films and the gates 180, 181, and 182 may be made of one of polysilicon or amorphous silicon, but the present inventive concept is not limited thereto.

Figure 15:
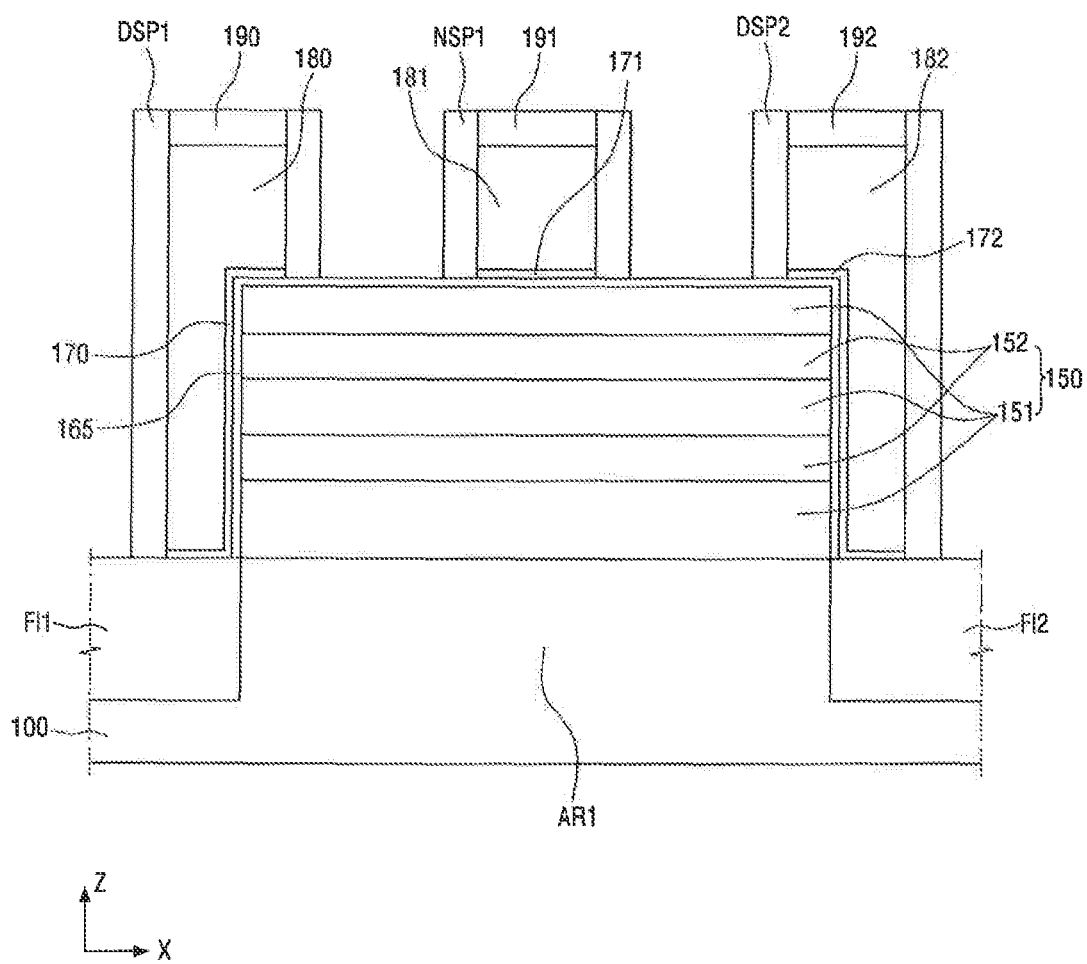

Referring to FIG. 15, the first normal gate spacer NSP1 and the first and second dummy gate spacers DSP1 and DSP2 are formed on side walls of the gates 180, 181, and 182.

In detail, a spacer layer that covers the gates 180, 181, and 182 and the semiconductor pattern structure 150 is formed on the substrate 100. Thereafter, the spacer layer is etched back to form the first normal gate spacer NSP1 and the first and second dummy gate spacers DSP1 and DSP2 on the side walls of the gates 180, 181, and 182.

Figure 16:
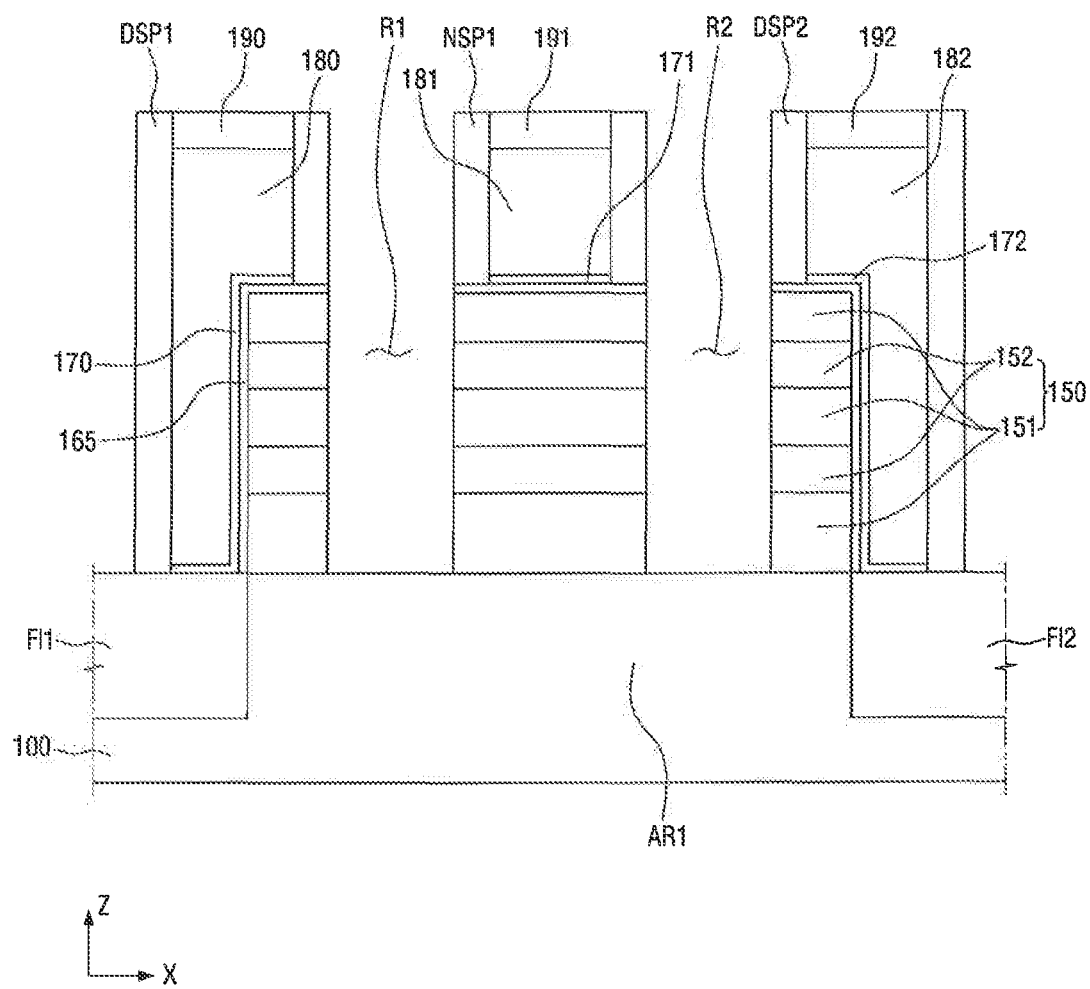

Referring to FIG. 16, the semiconductor pattern structure 150 exposed between the first normal gate spacer NSP1 and the first dummy gate spacer DSP1 and between the first normal gate spacer NSP1 and the second dummy gate spacer DSP2 is removed to form first and second recesses R1 and R2 in the semiconductor pattern structure 150.

In FIG. 16, while the first and second recesses R1 and R2 are formed, the entirety of the first semiconductor pattern 151 that overlaps with the first and second recesses R1 and R2 and contacts the first active region AR1 is removed to expose the top of the first active region AR1, but the present inventive concept is not limited thereto. In other words, part of the first semiconductor pattern 151 that overlaps with the first and second recesses R1 and R2 and contacts the first active region AR1 may remain.

The first semiconductor pattern 151 and the second semiconductor pattern 152 that are alternately stacked on the first active region AR1 are exposed through the sides of the first and second recesses R1 and R2.

Figure 17:
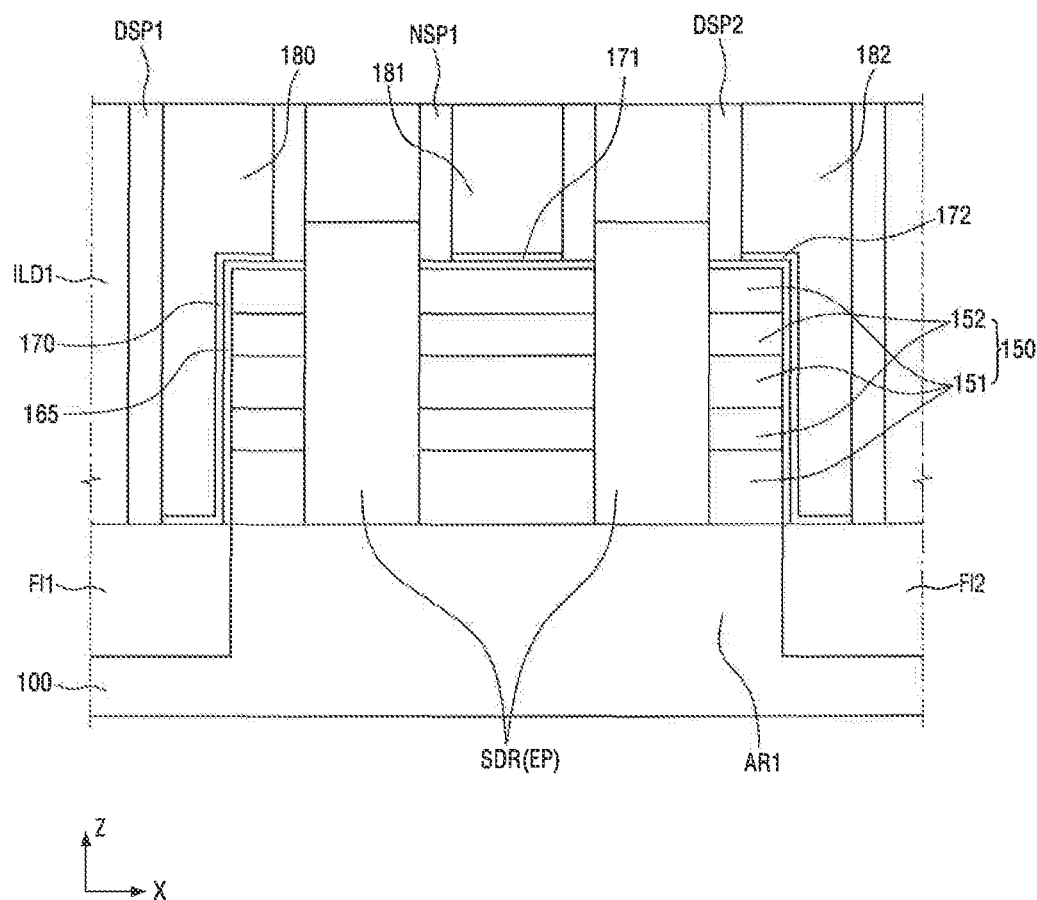

Referring to FIG. 17, the epitaxial layer EP that is filled in the first and second recesses R1 and R2 is formed. In other words, the source or drain SDR is formed between the first normal gate NG1 and the first dummy gate DG1 and between the first normal gate NG1 and the second dummy gate DG2.

The epitaxial layer EP may be formed by using an epitaxial growth process. When a part of the first semiconductor pattern 151 is left in a process of forming the first and second recesses R1 and R2 of FIG. 16 as described above, the first semiconductor pattern 151 that is left may be an epitaxial seed layer. As a result, the epitaxial seed layer (not illustrated) and the first semiconductor pattern 151 and the second semiconductor pattern 152 exposed through the sides of the first and second recesses R1 and R2 are used as seed layers, and as a result, the epitaxial layer EP may be grown. When an epitaxial seed layer (not illustrated) is not present, the first semiconductor pattern 151 and the second semiconductor pattern 152 exposed through the sides of the first and second recesses R1 and R2 are used as seed layers, and as a result, the epitaxial layer EP may be grown.

In other words, the epitaxial layer EP may contact the first semiconductor pattern 151 and the second semiconductor pattern 152.

After the epitaxial layer EP is formed, the first interlayer insulating layer ILD1, which covers the source or drain SDR, the first normal gate NG1, the first and second dummy gates DG1 and DG2, the first normal gate spacer NSP1, and the first and second dummy gate spacers DSP1 and DSP2, is formed on the substrate 100.

The first interlayer insulating layer ILD1 may include at least one of the low-dielectric material, the oxide film, the nitride film, and the oxy-nitride film. The low-dielectric material may include, for example, flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), high density plasma (HDP) oxide, plasma enhanced oxide (PEOX), flowable chemical vapor deposition (FCVD) oxide or combinations thereof.

Subsequently, until the first normal gate NG1 and the first and second dummy gates DG1 and DG2 are exposed, the first interlayer insulating layer ILD1 is planarized. As a result, the second mask patterns 190, 191, and 192 may be removed and the top of the first normal gate NG1 and the tops of the first and second dummy gates DG1 and DG2 may be exposed.

Figure 18:
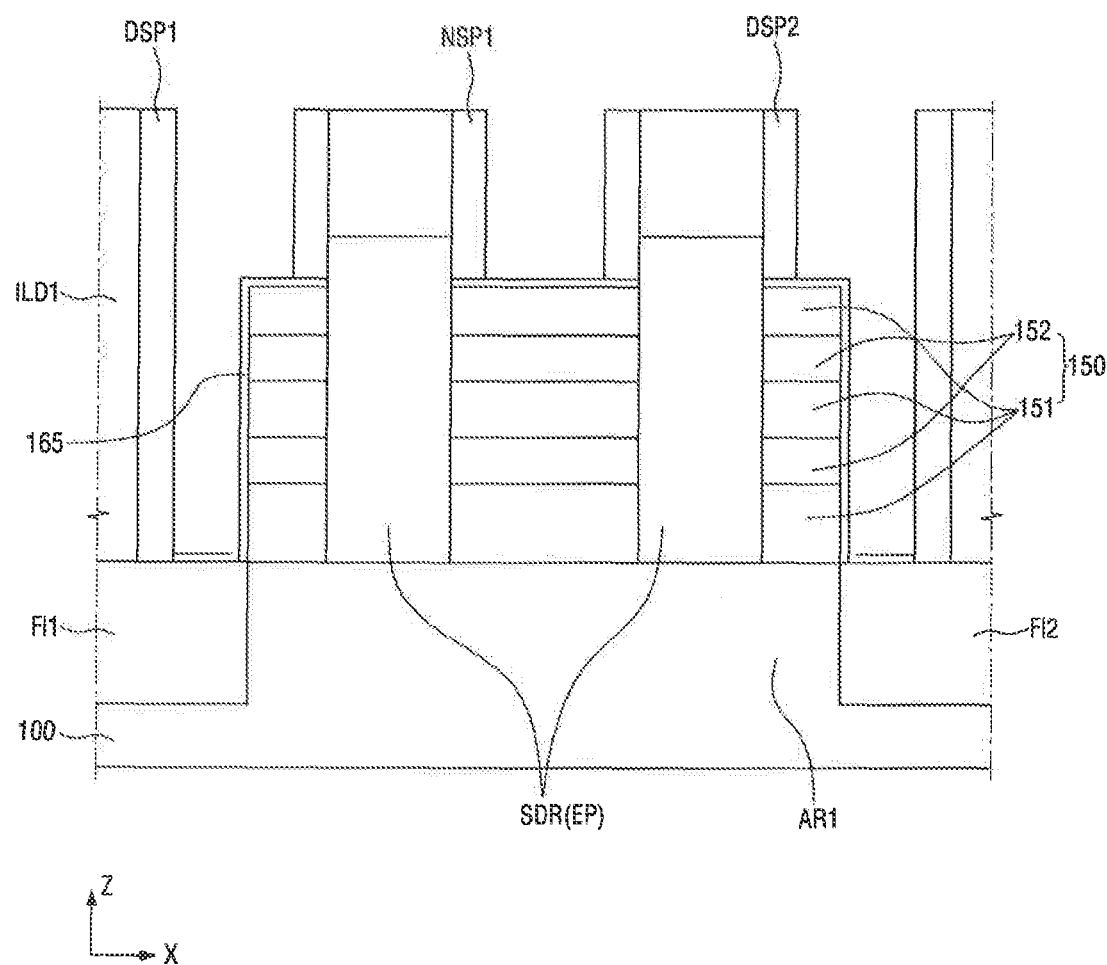

Referring to FIG. 18, the exposed first normal gate NG1, and first and second dummy gates DG1 and DG2 may be removed. Further, the first normal gate insulating layer NGI1 and the first and second dummy gate insulating layers DGI1 and DGI2 may also be removed.

In other words, the first normal gate NG1 and the first normal gate insulating layer NGI1 may be sequentially removed and the first and second dummy gates DG1 and DG2 and the first and second dummy gate insulating layers DGI1 and DGI2 may be sequentially removed.

A removal process of FIG. 18 may include forming a third mask pattern (not illustrated) that exposes the top of the first normal gate NG1 and the tops of the first and second dummy gates DG1 and DG2 and performing an etching process by using the third mask pattern (not illustrated) as the mask.

Figure 19:
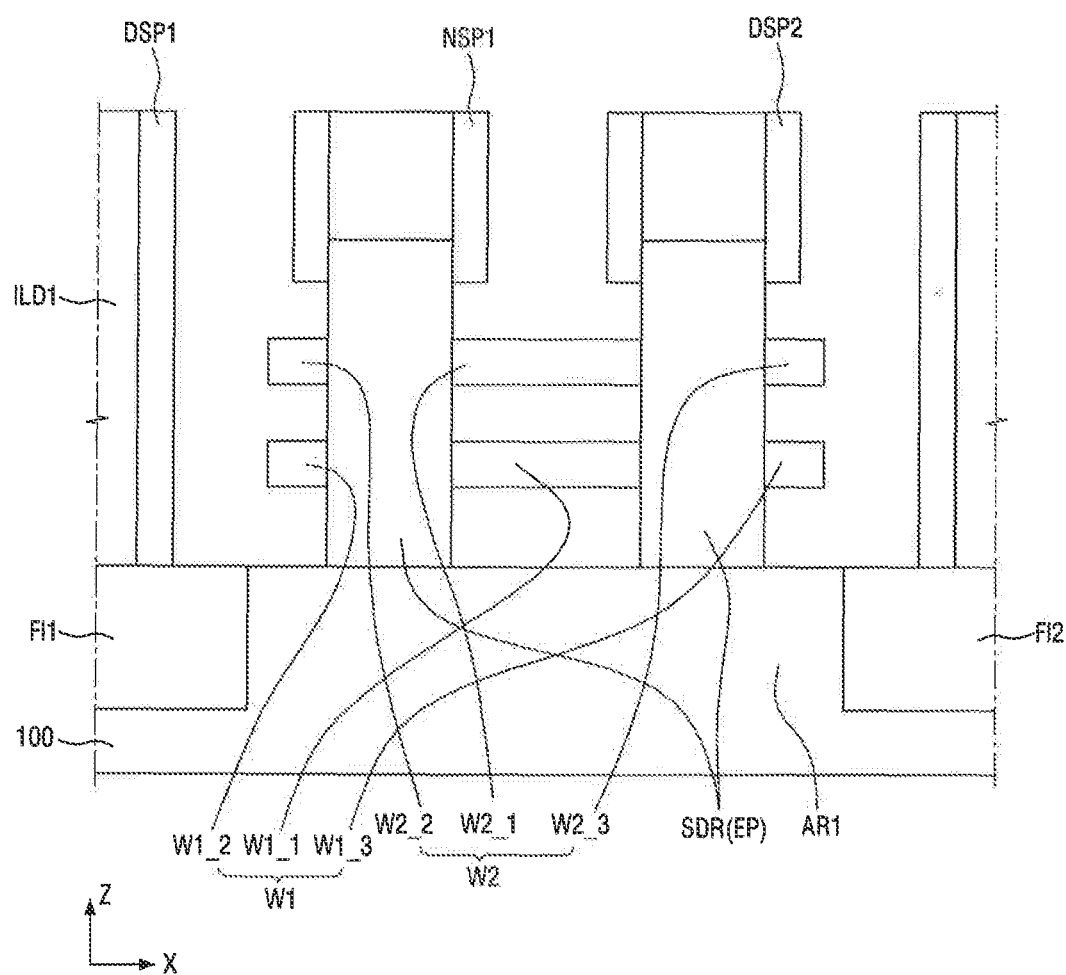

Referring to FIG. 19, first, by using a first etchant in which an etching rate for the insulating layer 165 is higher than an etching rate for the first and second semiconductor patterns 151 and 152, the insulating layer 165 is removed.

For example, when the insulating layer 165 is $SiO_2$, the first etchant may include HF and the first etchant may selectively remove only the insulating layer 165 which is made of $SiO_2$.

Subsequently, by using a second etchant in which an etching rate for the first semiconductor pattern 151 is higher than an etching rate for the second semiconductor pattern 152, the first semiconductor pattern 151 may be removed. However, a method for removing the first semiconductor pattern 151 is not limited thereto and the first semiconductor pattern 151 may be removed by using an isotropic dry etching process.

Through such a process, the first wire pattern W1 and the second wire pattern W2 configured by the second semiconductor pattern 152 are formed on the first active region AR1. In other words, one or more wire patterns may be formed on the first active region AR1.

Additionally, the first semiconductor pattern 151 is removed, and as a result, a space is formed. Further, the epitaxial layer EP may be exposed through the space.

Figure 20:
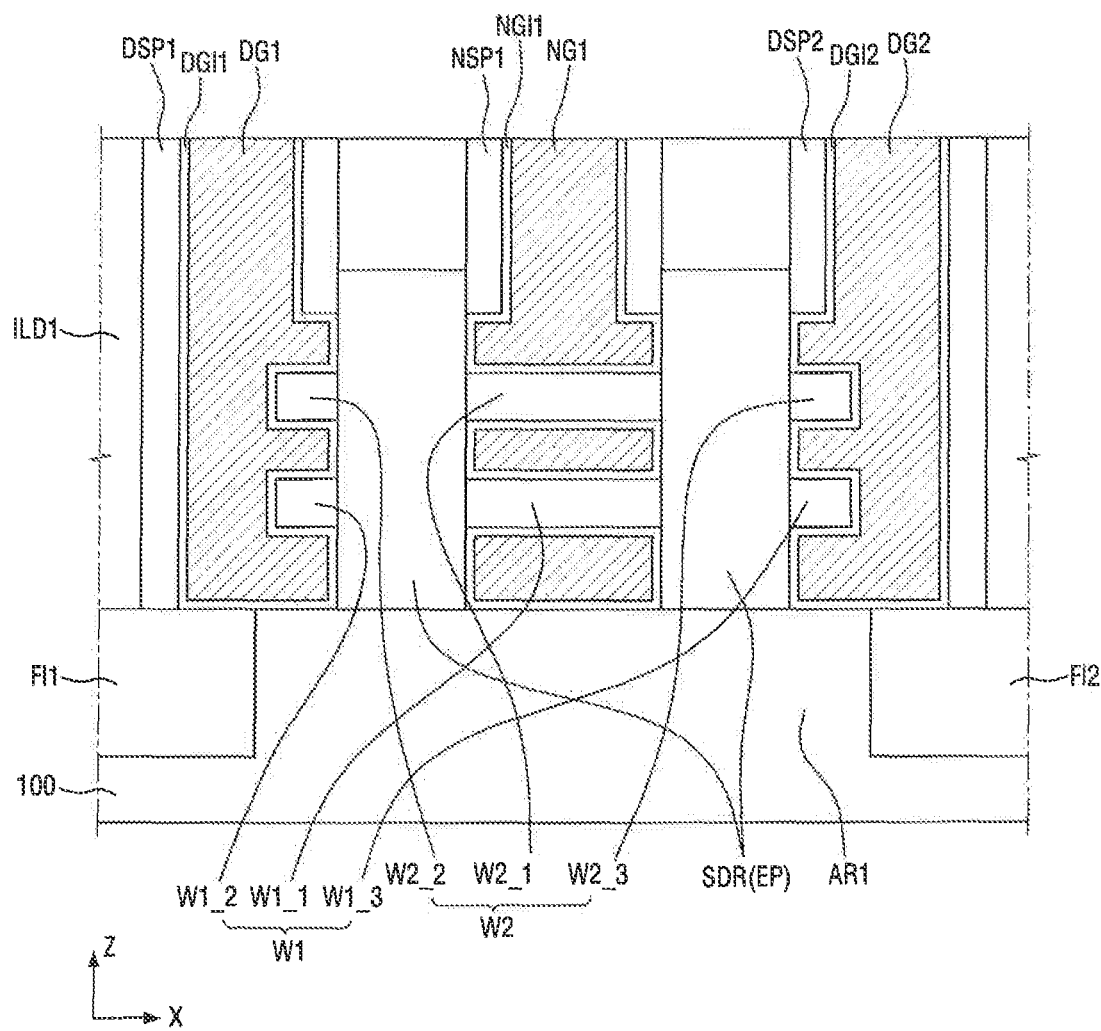

Referring to FIG. 20, the first normal gate insulating layer NGI1 is formed along the circumferences of the first and second wire patterns W1 and W2, the side wall of the first normal gate spacer NSP1, and the exposed epitaxial layer EP.

Further, the first dummy gate insulating layer DGI1 is formed along the circumference of one end of each of the first and second wire patterns W1 and W2, the side wall of the first dummy gate spacer DSP1, and the exposed epitaxial layer EP. In addition, the second dummy gate insulating layer DGI2 is formed along the circumference of the other end of each of the first and second wire patterns W1 and W2, the side wall of the second dummy gate spacer DSP2, and the exposed epitaxial layer EP.

Therefore, the exposed epitaxial layer (EP) part contacts the first normal gate insulating layer NGI1 and the first and second dummy gate insulating layers DGI1 and DGI2.

Subsequently, the first normal gate NG1 that covers the circumferences of the first and second wire patterns W1 and W2 is formed on the first normal gate insulating layer NGI1.

Further, the first dummy gate DG1 that covers the circumference of one end of each of the first and second wire patterns W1 and W2 and the cross-section of one end of each of the first and second wire patterns W1 and W2 is formed on the first dummy gate insulating layer DGI1.

In addition, the second dummy gate DG2 that covers the circumference of the other end of each of the first and second wire patterns W1 and W2 and the cross-section of the other end of each of the first and second wire patterns W1 and W2 is formed on the second dummy gate insulating layer DGI2.

Additionally, a planarizing process may be performed to form the first normal gate NG1, the first and second dummy gates DG1 and DG2, the first normal gate insulating layer NGI1, and the first and second dummy gate insulating layers DGI1 and DGI2. A detailed description thereof will be omitted.

Figure 21:
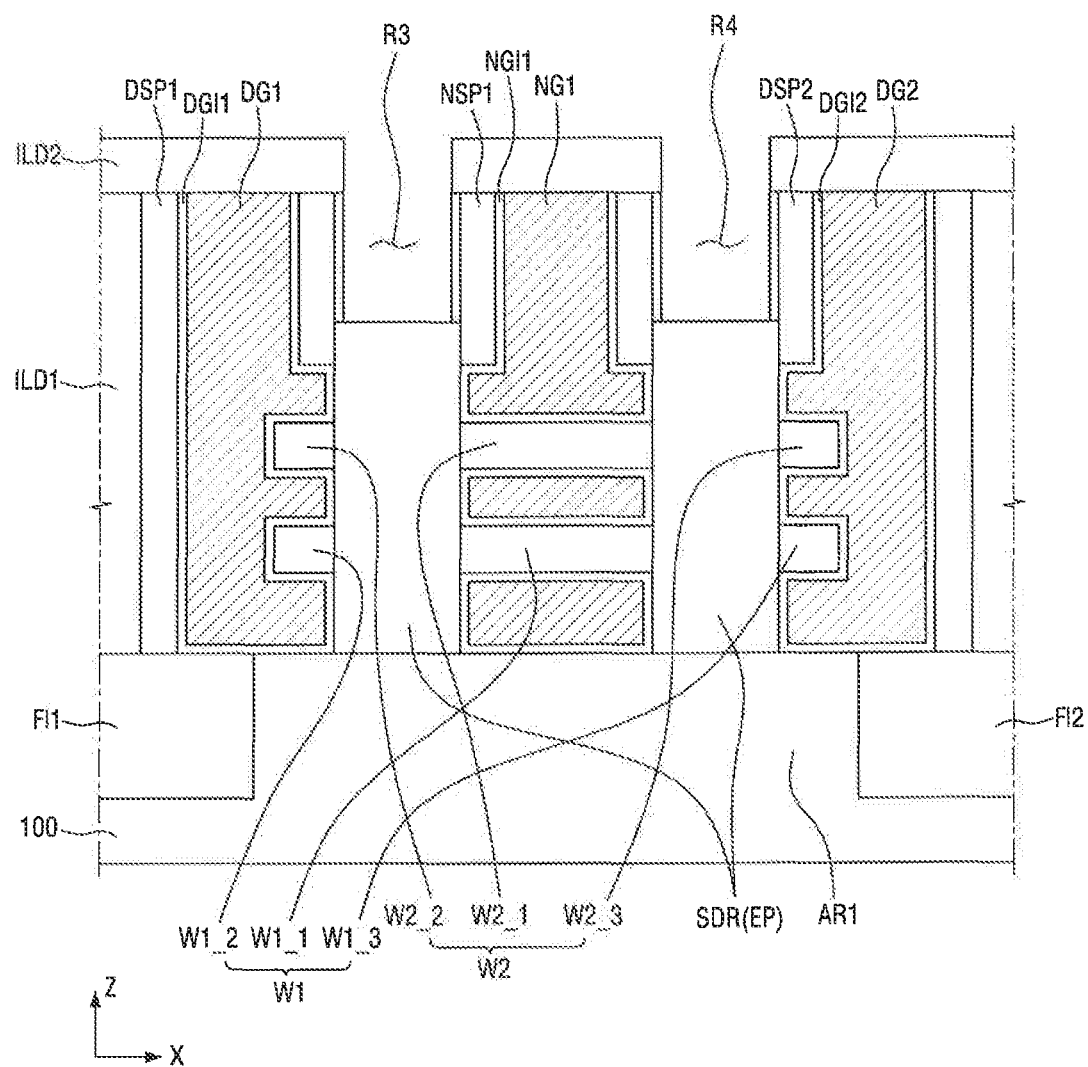

Referring to FIG. 21, the second interlayer insulating layer ILD2 may be formed to cover the first interlayer insulating layer ILD1, the first normal gate NG1, the first and second dummy gates DG1 and DG2, the first normal gate spacer NSP1, and the first and second dummy gate spacers DSP1 and DSP2.

After the second interlayer insulating layer ILD2 is formed, a fourth mask pattern (not illustrated) may be formed on the second interlayer insulating layer ILD2 and third and fourth recesses R3 and R4 may be formed by using the fourth mask pattern (not illustrated) as the mask.

Here, the second interlayer insulating layer ILD2 may include, for example, at least one of the low-dielectric material, the oxide film, the nitride film, and the oxy-nitride film.

Figure 22:
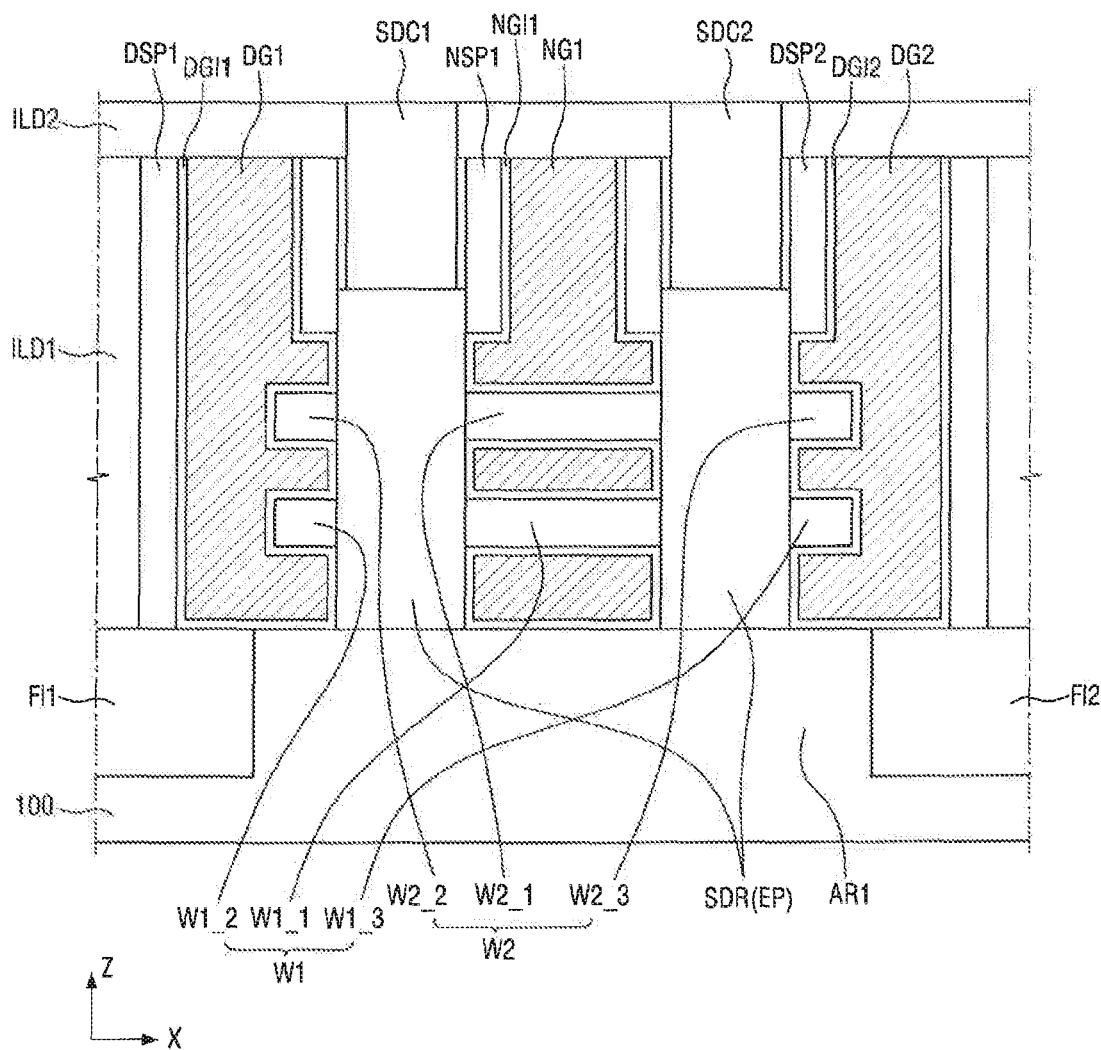

Referring to FIG. 22, first and second source or drain contacts SDC1 and SDC2 are formed and filled in the third and fourth recesses R3 and R4.

The first and second source or drain contacts SDC1 and SDC2 are used to form the semiconductor device 1 illustrated in FIG. 2.

The other semiconductor devices described above with reference to FIGS. 4-11 may also be manufactured by using the manufacturing method of the semiconductor device 1, which is described with reference to FIGS. 12 to 22.

Hereinafter, the semiconductor device 2 of FIG. 4 will be described with reference to FIGS. 23 to 25. Since the manufacturing process of FIGS. 12 to 20 described above is applicable to the semiconductor device 2 of FIG. 4, overlapping descriptions will be omitted.

Figure 23:
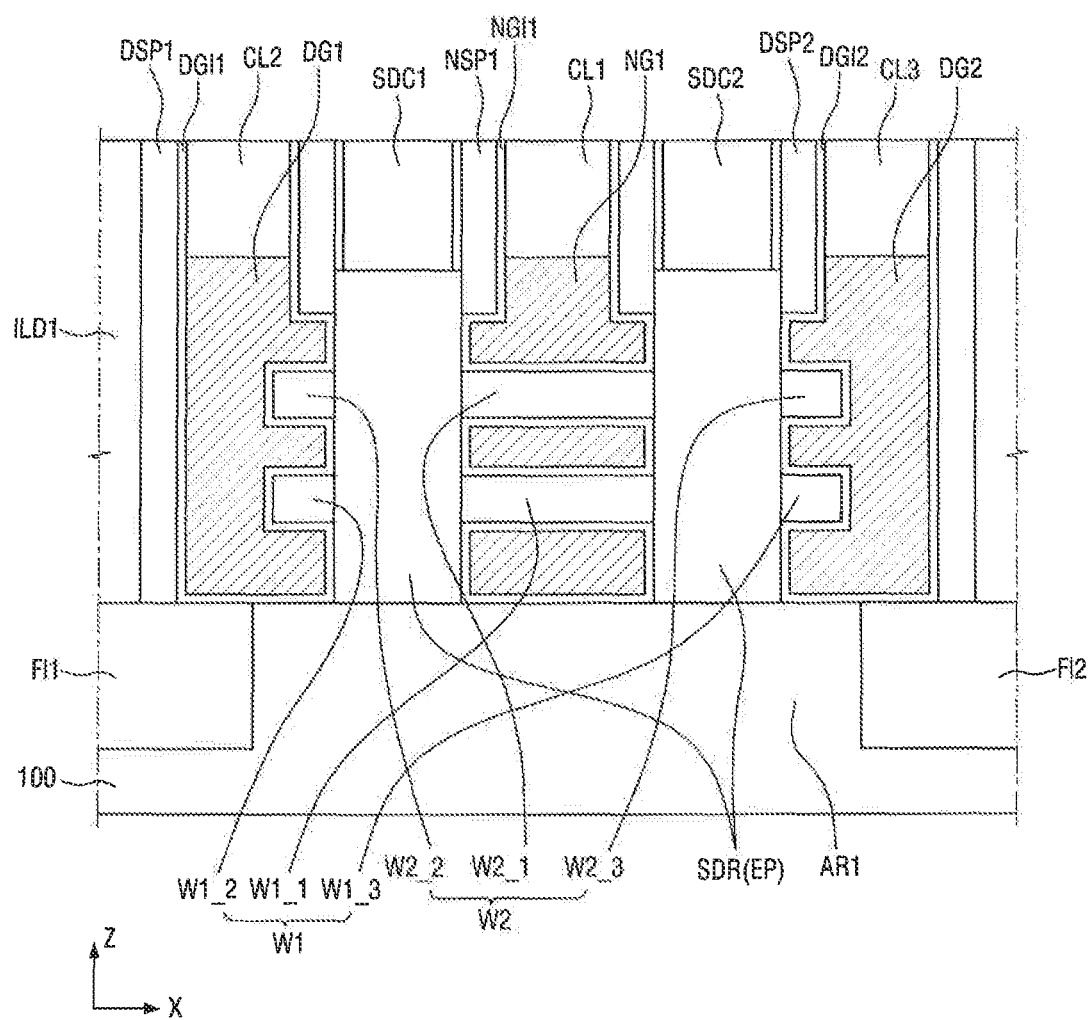
FIGS. 23, 24 and 25 are diagrams of steps of a method of manufacturing the semiconductor device of FIG. 4 according to an exemplary embodiment of the present inventive concept.
Figure 24:
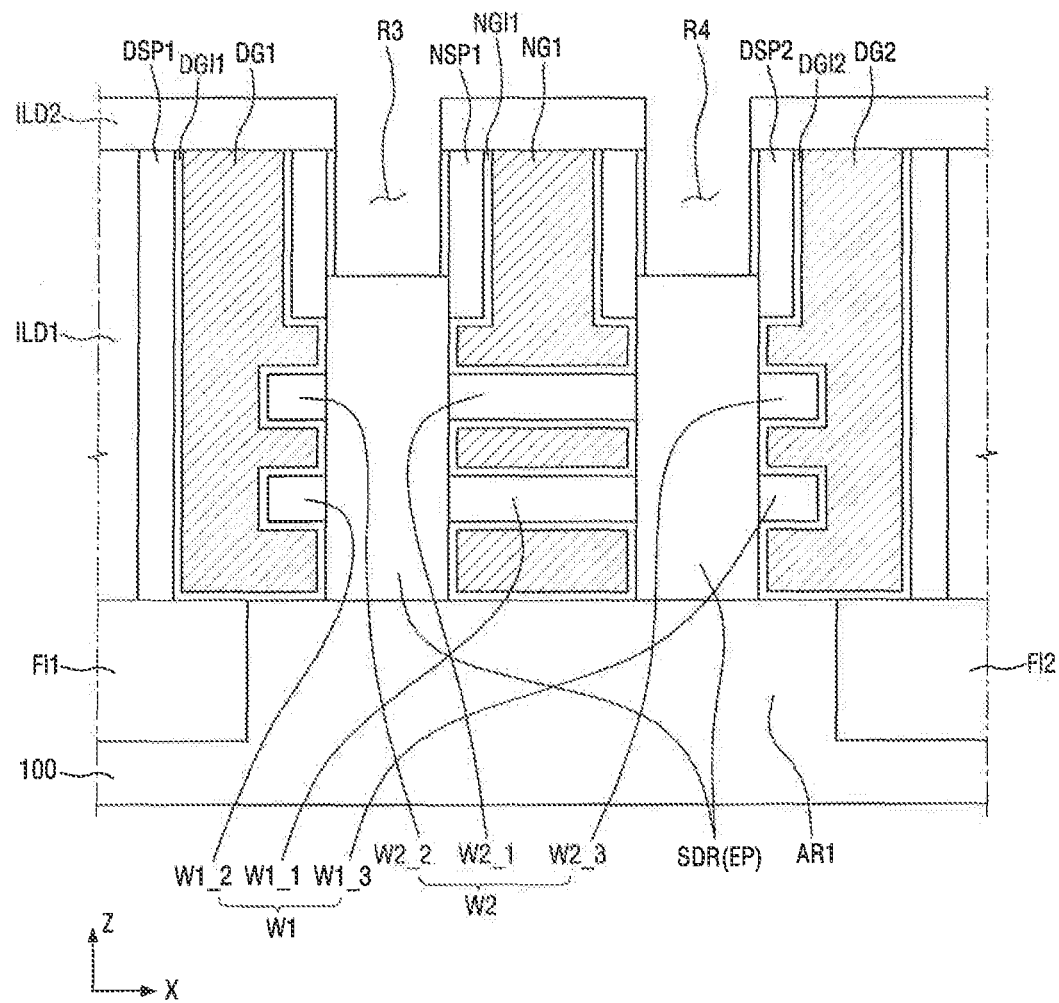
Figure 25:
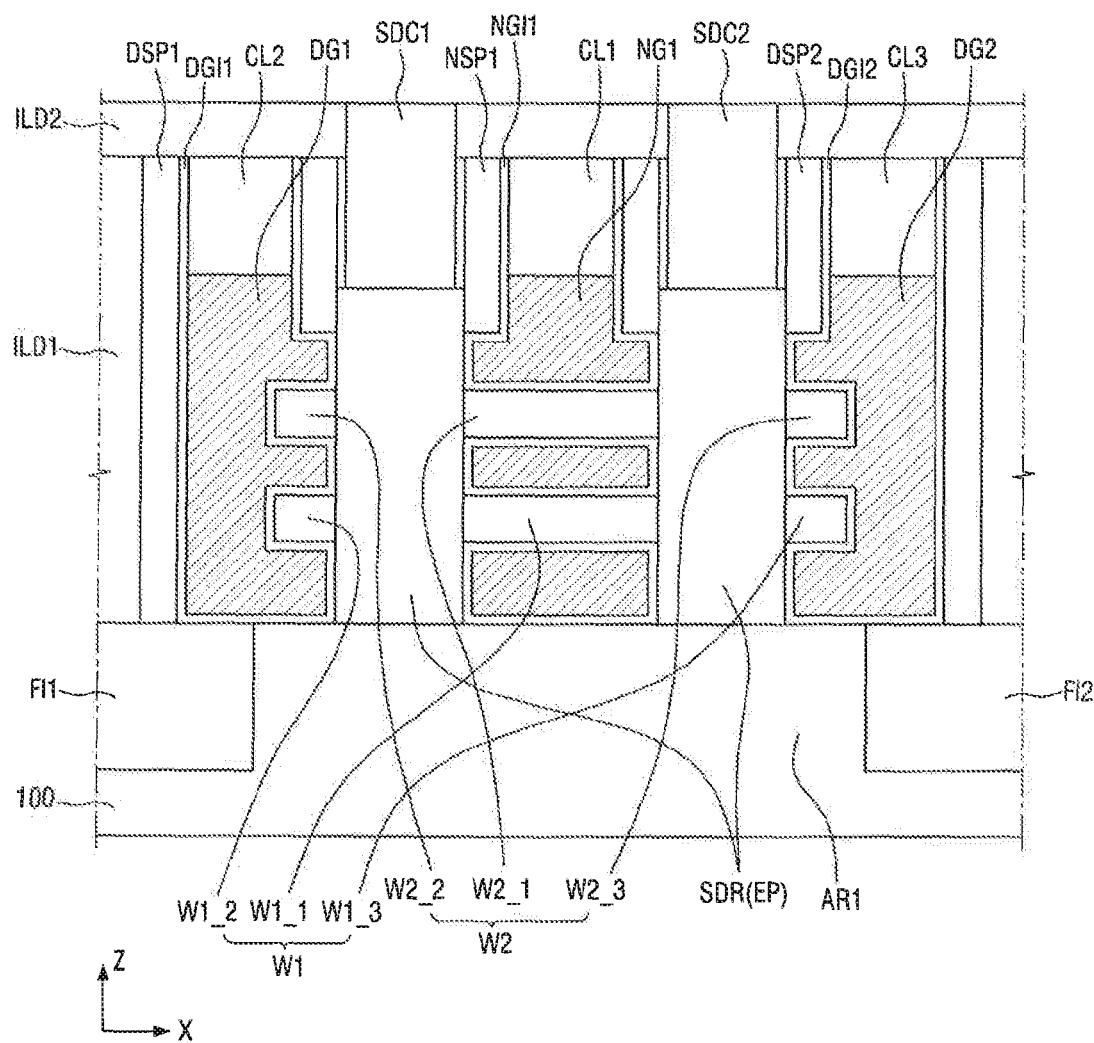

FIGS. 23 to 25 are diagrams of steps of a method of manufacturing the semiconductor device 2 of FIG. 4.

First, referring to FIG. 23, the top of each of the first normal gate NG1 and the first and second dummy gates DG1 and DG2 is partially removed and a capping layer (not illustrated) is formed to cover the first interlayer insulating layer ILD1, the first normal gate NG1, and the first and second dummy gates DG1 and DG2.

After the capping layer (not illustrated) is formed, the capping layer (not illustrated) is planarized until the top of the first interlayer insulating layer ILD1 is exposed to form first to third capping layers CL1 to CL3 illustrated in FIG. 23.

Here, the first to third capping layers CL1 to CL3 may include, for example, a material having the same etch selection ratio as the first interlayer insulating layer ILD1 and in more detail, SiN, but the present inventive concept is not limited thereto. In other words, in this case, the first interlayer insulating layer ILD1 may include the low-dielectric material or the oxide film.

Referring to FIG. 24, the second interlayer insulating layer ILD2 may be formed to cover the first interlayer insulating layer ILD1, the first normal gate NG1, the first and second dummy gates DG1 and DG2, the first normal gate spacer NSP1, the first and second dummy gate spacers DSP1 and DSP2, and the first to third capping layers CL1 to CL3.

After the second interlayer insulating layer ILD2 is formed, the fourth mask pattern (not illustrated) may be formed on the second interlayer insulating layer ILD2 and third and fourth recesses R3 and R4 may be formed by using the fourth mask pattern (not illustrated) as the mask.

Here, the second interlayer insulating layer ILD2 may include, for example, at least one of the low-dielectric material and the oxide film.

Referring to FIG. 25, the first and second source or drain contacts SDC1 and SDC2 are formed and filled in the third and fourth recesses R3 and R4.

The first and second source or drain contacts SDC1 and SDC2 are used to form the semiconductor device 2 illustrated in FIG. 4.

Figure 26:
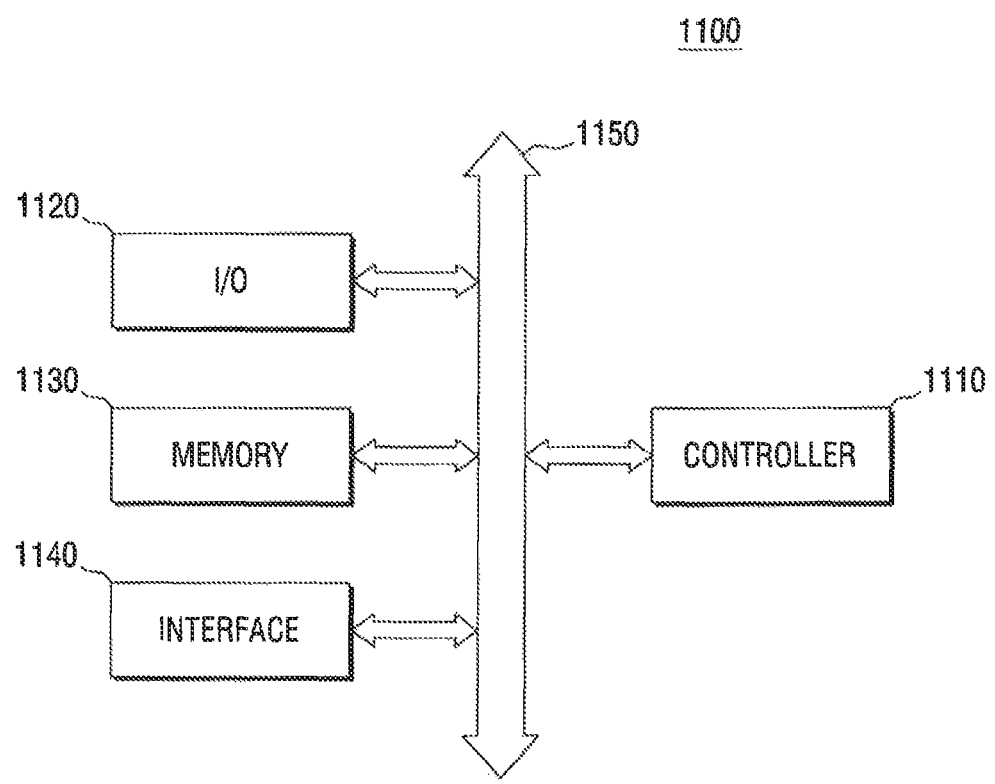
FIG. 26 is a block diagram of an electronic system including semiconductor devices according to exemplary embodiments of the present inventive concept.

FIG. 26 is a block diagram of an electronic system including semiconductor devices according to exemplary embodiments of the present inventive concept.

Referring to FIG. 26, the electronic system 1100 according to the current embodiment of the present inventive concept may include a controller 1110, an input/output (I/O) device 1120, a memory device 1130, an interface 1140, and a bus 1150. The controller 1110, the input/output device 1120, the memory device 1130, and/or the interface 1140 may be coupled to each other through the bus 1150. The bus 1150 corresponds to a path in which data move.

The controller 1110 may include at least one of a microprocessor, a digital signal processor, a microcontroller, and logic elements that may perform similar functions thereto. The input/output device 1120 may include a keypad, a keyboard, and a display device. The memory device 1130 may store data and/or a command. The interface 1140 may serve to transmit data to a communication network or receive data from the communication network. The interface 1140 may be a wired or wireless type. For example, the interface 1140 may include an antenna or a wired/wireless transceiver. Although not illustrated, the electronic system 1100 as an operating memory for improving an operation of the controller 1110 may further include a high-speed dynamic random access memory (DRAM) and/or static random access memory (SRAM). The semiconductor devices according to exemplary embodiments of the present inventive concept may be provided in the memory device 1130 or provided as a part of the controller 1110, the input/output (I/O) device 1120, or the like.

The electronic system 1100 may be applied to a personal digital assistant (PDA), a portable computer, a web tablet, a wireless phone, a mobile phone, a digital music player, a memory card, or all electronic products that may transmit/or receive information under a wireless environment.

Figure 27:
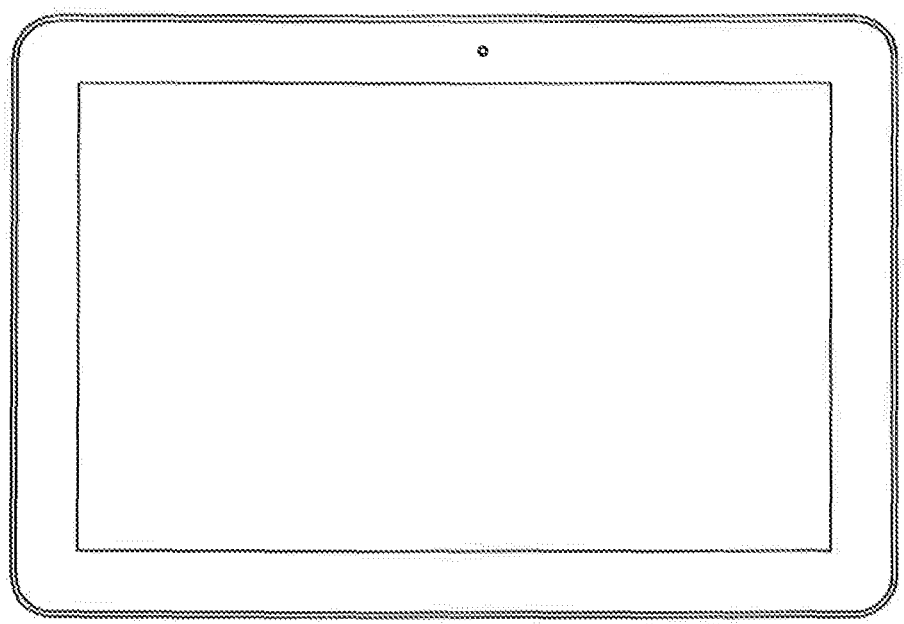
FIGS. 27 and 28 each illustrate a semiconductor system to which semiconductor devices according to exemplary embodiments of the present inventive concept can be applied.
Figure 28:
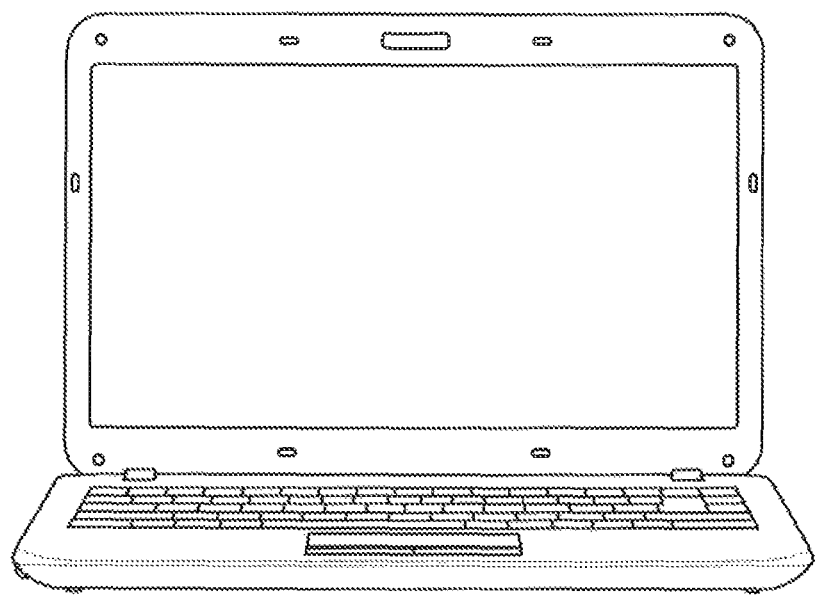

FIGS. 27 and 28 each illustrate a semiconductor system to which the semiconductor devices according to exemplary embodiments of the present inventive concept can be applied. FIG. 26 illustrates a tablet personal computer (PC) and FIG. 27 illustrates a notebook computer. At least one of the semiconductor devices according to exemplary embodiments of the present inventive concept may be used for the tablet PC, the notebook computer, and the like. It is apparent to those skilled in the art that the semiconductor devices according to exemplary embodiments of the present inventive concept may be applied to other integrated circuit devices which are not illustrated.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   an active region having a field insulating layer disposed at a first side thereof;
   a first wire pattern formed on the active region and extended in a first direction;
   a normal gate formed on the active region, extended in a second direction crossing the first direction and covering the first wire pattern; and
   a dummy gate having a first part which overlaps a first end of the field insulating layer and a second part which overlaps the active region, wherein the dummy gate is formed on the active region and spaced apart from the normal gate in the first direction,
   wherein the first wire pattern penetrates a third part of the dummy gate and the dummy gate covers a first end of the first wire pattern.

2. The semiconductor device of claim 1, further comprising:
   a normal gate insulating layer formed along a circumference of the first wire pattern and a first side wall of the normal gate; and
   a dummy gate insulating layer formed along a circumference of the first end of the first wire pattern, a cross-section at an end point of the first end of the first wire pattern, and a first side wall of the dummy gate.

3. The semiconductor device of claim 2, further comprising:
   sources or drains disposed at first and second sides of the normal gate,
   wherein the sources or drains include an epitaxial layer.

4. The semiconductor device of claim 3, wherein:
   the epitaxial layer includes a first part and a second part,
   the first part is directly connected with the first wire pattern, and
   the second part contacts the normal gate insulating layer and the dummy gate insulating layer.

5. The semiconductor device of claim 3, wherein the epitaxial layer has a diamond shape, a circular shape, or a rectangular shape.

6. The semiconductor device of claim 2, further comprising:
   normal gate spacers formed at the first side wall and a second side wall of the normal gate; and
   dummy gate spacers formed at the first side wall and a second side wall of the dummy gate,
   wherein the normal gate insulating layer is formed along a side wall of at least one of the normal gate spacers and the dummy gate insulating layer is formed along a side wall of at least one of the dummy gate spacers.

7. The semiconductor device of claim 1, further comprising:
   a second wire pattern formed on the first wire pattern and extended in the first direction,
   wherein the normal gate covers the second wire pattern.

8. A semiconductor device, comprising:
   first and second active regions spaced apart from each other in a first direction with a field insulating layer interposed therebetween and having respective tops formed on the same plane;
   a first wire pattern formed on the first active region and extended in the first direction;
   a second wire pattern formed on the second active region and extended in the first direction, wherein a height of the second wire pattern from the tops of the first and second active regions is substantially the same as that of the first wire pattern;

a first normal gate formed on the first active region and extended in a second direction different from the first direction and covering the first wire pattern;

a second normal gate formed on the second active region and extended in the second direction and covering the second wire pattern;

a first dummy gate having a first part which overlaps a first end of the field insulating layer and a second part which overlaps the first active region, wherein the first dummy gate is formed on the first active region and spaced apart from the first normal gate in the first direction; and a second dummy gate having a first part which overlaps a second end of the field insulating layer and a second part which overlaps the second active region, wherein the second dummy gate is formed on the second active region and spaced apart from the second normal gate in the first direction, wherein the first wire pattern penetrates a third part of the first dummy gate and the first dummy gate covers a first end of the first wire pattern, and the second wire pattern penetrates a third part of the second dummy gate and the second dummy gate covers a first end of the second wire pattern.

9. The semiconductor device of claim 8, further comprising:

a first normal gate insulating layer formed along a circumference of the first wire pattern and a first side wall of the first normal gate; and a second normal gate insulating layer formed along a circumference of the second wire pattern and a first side wall of the second normal gate.

10. The semiconductor device of claim 9, further comprising:

a first dummy gate insulating layer formed along a circumference of the first end of the first wire pattern, a cross-section at an end point of the first end of the first wire pattern, and a first side wall of the first dummy gate; and a second dummy gate insulating layer formed along a circumference of the first end of the second wire pattern, a cross-section at an end point of the first end of the second wire pattern, and a first side wall of the second dummy gate.

11. The semiconductor device of claim 10, further comprising:

a first source or drain disposed at first and second sides of the first normal gate; and a second source or drain disposed at first and second sides of the second normal gate, wherein the first source or drain includes a first epitaxial layer and the second source or drain includes a second epitaxial layer.

12. The semiconductor device of claim 10, further comprising:

first dummy gate spacers formed at the first side wall and a second side wall of the first dummy gate; and second dummy gate spacers formed at the first side wall and a second side wall of the second dummy gate, wherein the first dummy gate insulating layer is formed along a side wall of at least one of the first dummy gate spacers and the second dummy gate insulating layer is formed along a side wall of at least one of the second dummy gate spacers.

13. The semiconductor device of claim 9, further comprising:

first normal gate spacers formed at the first side wall and a second side wall of the first normal gate; and second normal gate spacers formed at the first side wall and a second side wall of the second normal gate, wherein the first normal gate insulating layer is formed along a side wall of at least one of the first normal gate spacers and the second normal gate insulating layer is formed along a side wall of at least one of the second normal gate spacers.

14. The semiconductor device of claim 8, further comprising:

a third wire pattern formed on the first wire pattern and extended in the first direction; and a fourth wire pattern formed on the second wire pattern and extended in the first direction, wherein the first normal gate covers the third wire pattern and the second normal gate covers the fourth wire pattern.

15. The semiconductor device of claim 14, wherein a height of the third wire pattern is substantially the same as that of the fourth wire pattern from the tops of the first and second active regions.

16. The semiconductor device of claim 14, further comprising:

a fifth wire pattern formed on the third wire pattern and extended in the first direction, wherein the first normal gate covers the fifth wire pattern, and a height of the fifth wire pattern is larger than that of the fourth wire pattern from the tops of the first and second active regions.

17. The semiconductor device of claim 8, wherein the first and second wire patterns include different materials.

18. The semiconductor device of claim 17, wherein:

the first active region is a p-channel field effect transistor (PFET) formation region and the second active region is an n-channel field effect transistor (NFET) formation region, and the first wire pattern includes SiGe or Ge and the second wire pattern includes Si or III-V-based compound semiconductors.

19. A semiconductor device, comprising:

a source or drain region formed on a substrate;

a normal gate and a dummy gate formed on the substrate and spaced apart from each other in a first direction with the source or drain region interposed therebetween and extended in a second direction crossing the first direction; and a wire pattern which protrudes from first and second sides of the source or drain region in the first direction, wherein a width of a region where the wire pattern and the normal gate overlap each other in the first direction is different from a width of a region where the wire pattern and the dummy gate overlap each other in the first direction.

20. The semiconductor device of claim 19, wherein the width of the region where the wire pattern and the normal gate overlap each other in the first direction is larger than the width of the region where the wire pattern and the dummy gate overlap each other in the first direction.

21. A semiconductor device, comprising:

a first normal gate disposed on an active region of a substrate;

a first dummy gate disposed on the substrate at a first side of the first normal gate;

a first source or drain disposed between the first normal gate and the first dummy gate and on the active region;

a second dummy gate disposed on the substrate at a second side of the first normal gate;

a second source or drain disposed between the first normal gate and the second dummy gate;

a first wire pattern covered by the first normal gate, the first dummy gate and the second dummy gate; and a second wire pattern covered by the first normal gate, the first dummy gate and the second dummy gate.

22. The semiconductor device of claim 21, wherein the first and second wire patterns are channel regions.

23. The semiconductor device of claim 21, wherein the second wire pattern is disposed above the first wire pattern.

* * * * *